(12) United States Patent
Ichijo et al.

(10) Patent No.: US 8,441,010 B2
(45) Date of Patent: May 14, 2013

(54) SEMICONDUCTOR DEVICE

(75) Inventors: Mitsuhiro Ichijo, Zama (JP); Toshiya Endo, Isehara (JP); Kunihiko Suzuki, Isehara (JP); Yasuhiko Takemura, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 149 days.

(21) Appl. No.: 13/164,806

(22) Filed: Jun. 21, 2011

(65) Prior Publication Data

US 2012/0001168 A1    Jan. 5, 2012

(30) Foreign Application Priority Data

Jul. 1, 2010    (JP) ................................. 2010-150849

(51) Int. Cl.
*H01L 29/786*    (2006.01)

(52) U.S. Cl.
USPC ............... 257/43; 257/66; 257/410; 257/411; 257/E29.296

(58) Field of Classification Search ........ 257/43, 257/66, 410, 411, E29.296
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.

(Continued)

*Primary Examiner* — Long Pham
(74) *Attorney, Agent, or Firm* — Eric J. Robinson; Robinson Intellectual Property Law Office, P.C.

(57) ABSTRACT

In a transistor including an oxide semiconductor, hydrogen in the oxide semiconductor leads to degradation of electric characteristics of the transistor. Thus, an object is to provide a semiconductor device having good electrical characteristics. An insulating layer in contact with an oxide semiconductor layer where a channel region is formed is formed by a plasma CVD method using a silicon halide. The insulating layer thus formed has a hydrogen concentration less than $6\times10^{20}$ atoms/$cm^3$ and a halogen concentration greater than or equal to $1\times10^{20}$ atoms/$cm^3$; accordingly, hydrogen diffusion into the oxide semiconductor layer can be prevented and hydrogen in the oxide semiconductor layer is inactivated or released from the oxide semiconductor layer by the halogen, whereby a semiconductor device having good electrical characteristics can be provided.

20 Claims, 13 Drawing Sheets

U.S. PATENT DOCUMENTS

| | | |
|---|---|---|
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,642,114 B2 | 1/2010 | Yamaguchi et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0118166 A1 | 6/2006 | Iwaki |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0186437 A1 | 7/2009 | Akimoto |
| 2009/0186445 A1 | 7/2009 | Akimoto |
| 2009/0189155 A1 | 7/2009 | Akimoto |
| 2009/0189156 A1 | 7/2009 | Akimoto |
| 2009/0278122 A1 | 11/2009 | Hosono et al. |
| 2009/0280600 A1 | 11/2009 | Hosono et al. |
| 2010/0003783 A1 | 1/2010 | Akimoto |
| 2010/0038639 A1 | 2/2010 | Akimoto |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0233847 A1 | 9/2010 | Ohara et al. |
| 2010/0295041 A1 | 11/2010 | Kumomi et al. |
| 2011/0053322 A1 | 3/2011 | Sasaki et al. |
| 2011/0068336 A1 | 3/2011 | Yamazaki et al. |
| 2011/0309355 A1 | 12/2011 | Ichijo et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-075987 | 3/2002 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-074049 | 3/2006 |
| JP | 2006-165528 | 6/2006 |
| JP | 2007-096055 | 4/2007 |
| JP | 2007-123861 | 5/2007 |
| WO | 03/011196 | 2/2003 |
| WO | WO-2004/114391 | 12/2004 |

OTHER PUBLICATIONS

Dembo.H et al., "RFCPUs on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350°C,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUs on Flexible and Glass Substrates for Secure RFID Systems,", Journal of Solid-State Circuits, 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-in. AMOLED Display With Driver Circuit Using Amorphous In-Ga-Zn-Oxide TFTs,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 in. QVGA AMOLED Display Using In-Ga-Zn-Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel, YbFe2O4, and Yb2Fe3O7 Types of Structures for Compunds in the In2O3 and Sc2O3-A2O3-BO Systems [A; Fe, Ga, or Al; B: Mg, Mn, Fe, Ni, Cu,Or Zn]at Temperatures Over 1000°C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layerd,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

(α-1)

(α-2)

◯ : Ga  ◐ : O  ○ : H

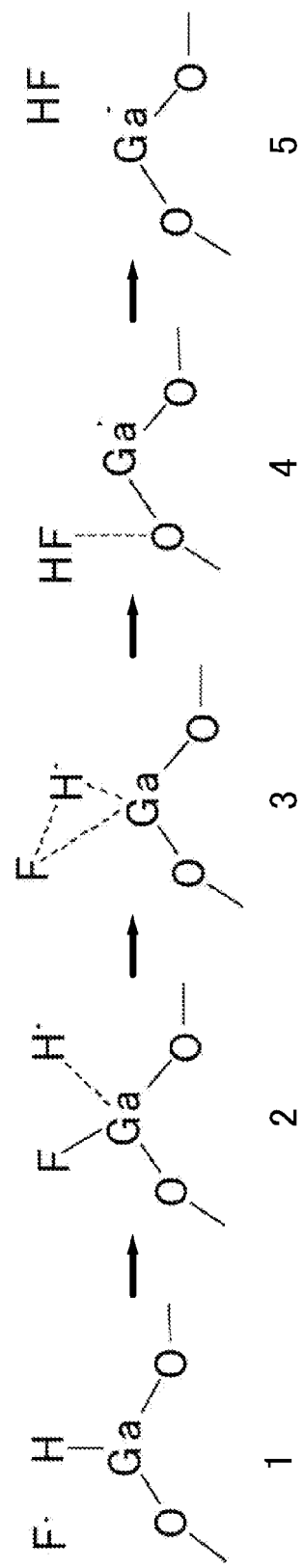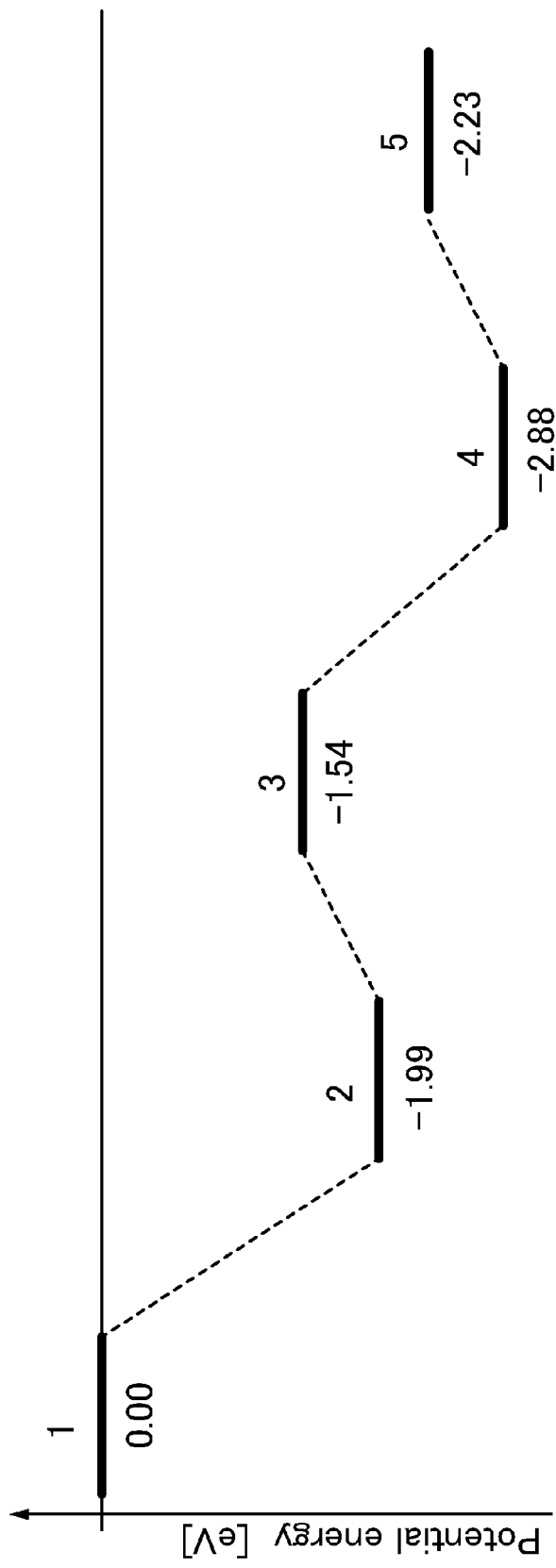
FIG. 5A
FIG. 5B

SEMICONDUCTOR DEVICE

BACKGROUND OF THE INVENTION

1. Field of the Invention

One embodiment of the present invention relates to a semiconductor device including an oxide semiconductor and a manufacturing method thereof.

In this specification, the term semiconductor device refers to all devices that can function by utilizing semiconductor characteristics, and electrooptic devices, semiconductor circuits, and electronic devices are all semiconductor devices.

2. Description of the Related Art

In recent years, transistors are used for many liquid crystal display devices and light-emitting display devices typified by flat panel displays, and they are formed with silicon semiconductors, such as amorphous silicon or polycrystalline silicon, over a glass substrate.

Attention has been directed to a technique in which, instead of such silicon semiconductors, oxide semiconductors are used for transistors.

Examples of the oxide semiconductor include zinc oxide, which is one-metal oxide, and In—Ga—Zn—O-based oxide, which is a homologous compound. Techniques have been disclosed in which such an oxide semiconductor is used to form transistors as switching elements and the like in pixels of a display device (see Patent Documents 1 to 3).

REFERENCE

[Patent Document 1] Japanese Published Patent Application No. 2006-165528

[Patent Document 2] Japanese Published Patent Application No. 2007-96055

[Patent Document 3] Japanese Published Patent Application No. 2007-123861

SUMMARY OF THE INVENTION

A transistor in which a channel region is formed in an oxide semiconductor has a problem: the threshold voltage ($V_{th}$) is easily shifted in the negative direction and a non-negligible amount of drain current flows even in the state where a potential of a gate electrode is equal to a potential of a source electrode ($V_{gs}$=0 V).

In view of the above problem, an object of one embodiment of the invention disclosed in this specification is to provide a semiconductor device having good electrical characteristics.

In order to achieve the above object, an insulating layer having a low hydrogen content and containing a halogen such as fluorine or chlorine is used as a gate insulating layer which is in contact with an oxide semiconductor layer where a channel region is formed, whereby movement of hydrogen from the gate insulating layer to the oxide semiconductor layer is reduced and hydrogen in the oxide semiconductor layer is inactivated or released from the oxide semiconductor layer. Thus, the hydrogen content of the oxide semiconductor layer can be reduced.

Specifically, a gate insulating layer having a hydrogen concentration less than $6\times10^{20}$ atoms/cm$^3$, preferably less than or equal to $2\times10^{20}$ atoms/cm$^3$, and more preferably less than or equal to $5\times10^{19}$ atoms/cm$^3$, and a halogen concentration greater than or equal to $1\times10^{19}$ atoms/cm$^3$, preferably greater than or equal to $1\times10^{20}$ atoms/cm$^3$ is used.

One embodiment of the present invention is a semiconductor device including a gate electrode layer, an oxide semiconductor layer where a channel region is formed, a source electrode layer and a drain electrode layer that are electrically connected to the oxide semiconductor layer, a gate insulating layer between the gate electrode layer and the oxide semiconductor layer, and an insulating layer that faces the gate insulating layer with the oxide semiconductor layer between the insulating layer and the gate insulating layer and that is in contact with the oxide semiconductor layer. The hydrogen concentration in the insulating layer is less than $6\times10^{20}$ atoms/cm$^3$, preferably less than or equal to $2\times10^{20}$ atoms/cm$^3$, more preferably less than or equal to $5\times10^{19}$ atoms/cm$^3$ and the halogen concentration in the insulating layer is greater than or equal to $1\times10^{19}$ atoms/cm$^3$, preferably greater than or equal to $1\times10^{20}$ atoms/cm$^3$.

Another embodiment of the present invention is a bottom-gate transistor in which an oxide semiconductor layer overlaps a gate electrode layer with the gate insulating layer interposed therebetween. Another embodiment of the present invention is a top-gate transistor in which a gate electrode layer overlaps an oxide semiconductor layer with the gate insulating layer interposed therebetween.

In another embodiment of the present invention, the gate insulating layer is an oxide insulating layer including silicon oxide, silicon oxynitride, silicon nitride oxide, hafnium oxide, aluminum oxide, or tantalum oxide.

The gate insulating layer may include a first gate insulating layer that is in contact with the gate electrode layer and a second gate insulating layer that is in contact with the oxide semiconductor layer. In that case, by forming the second gate insulating layer using a material that has a low hydrogen content and includes a halogen, movement of hydrogen from the second gate insulating layer to the oxide semiconductor layer is reduced and hydrogen in the oxide semiconductor layer is inactivated or released from the oxide semiconductor layer. Thus, the hydrogen content of the oxide semiconductor layer can be reduced.

Another embodiment of the present invention is a semiconductor device including a gate insulating layer that includes a first gate insulating layer in contact with a gate electrode layer and a second gate insulating layer in contact with the oxide semiconductor layer. The hydrogen concentration in the second gate insulating layer is less than $6\times10^{20}$ atoms/cm$^3$, preferably less than or equal to $2\times10^{20}$ atoms/cm$^3$, more preferably less than or equal to $5\times10^{19}$ atoms/cm$^3$. The halogen concentration in the second gate insulating layer is greater than or equal to $1\times10^{19}$ atoms/cm$^3$, preferably greater than or equal to $1\times10^{20}$ atoms/cm$^3$.

Further, by forming another insulating layer that is included in the semiconductor device and is in contact with the oxide semiconductor layer using a material that has a low hydrogen content and includes a halogen, movement of hydrogen from the insulating layer to the oxide semiconductor layer is reduced and hydrogen in the oxide semiconductor layer is inactivated or released from the oxide semiconductor layer. Thus, the hydrogen content of the oxide semiconductor layer can be reduced.

Another embodiment of the present invention is a semiconductor device in which the hydrogen concentration in an insulating layer that is in contact with an oxide semiconductor layer is less than $6\times10^{20}$ atoms/cm$^3$, preferably less than or equal to $2\times10^{20}$ atoms/cm$^3$, more preferably less than or equal to $5\times10^{19}$ atoms/cm$^3$, and the halogen concentration in the insulating layer that is in contact with the oxide semiconductor layer is greater than or equal to $1\times10^{20}$ atoms/cm$^3$, preferably greater than or equal to $1\times10^{21}$ atoms/cm$^3$.

Another embodiment of the present invention is a top-gate transistor and a semiconductor device including the top-gate transistor. In the top-gate transistor, the hydrogen concentration in an insulating layer that is in contact with an oxide semiconductor layer and between the oxide semiconductor layer and a substrate is less than $6\times10^{20}$ atoms/cm$^3$, preferably less than or equal to $2\times10^{20}$ atoms/cm$^3$, more preferably less than or equal to $5\times10^{19}$ atoms/cm$^3$, and the halogen concentration in the insulating layer is greater than or equal to $1\times10^{20}$ atoms/cm$^3$, preferably greater than or equal to $1\times10^{21}$ atoms/cm$^3$. The thickness of the insulating layer is five or more times as thick as the total thickness of the oxide semiconductor layer and the gate insulating layer.

Another embodiment of the present invention is a top-gate transistor and a semiconductor device including the top-gate transistor. The top-gate transistor includes an insulating layer over a substrate, an oxide semiconductor layer in contact with the insulating layer, a pair of conductive regions in contact with the oxide semiconductor layer, and a gate electrode layer over the oxide semiconductor layer and the conductive regions with the insulating film interposed therebetween. The conductive regions are not in contact with the insulating layer.

Another embodiment of the present invention is a semiconductor device including an insulating film which includes silicon oxide as a main component, is in contact with the oxide semiconductor layer, and is formed using a silicon halide such as silicon tetrafluoride (SiF$_4$) or silicon tetrachloride (SiCl$_4$) as a source gas. Here, an insulating film including silicon oxide as a main component refers to an insulating film in which 70% or greater, preferably 90% or greater of elements other than oxygen in the film is silicon.

According to one embodiment of the present invention, a semiconductor device having good electrical characteristics can be provided.

BRIEF DESCRIPTION OF THE DRAWINGS

FIGS. 5A and 5B illustrate reaction formulae and an energy diagram of a reaction for releasing a hydrogen atom.

DETAILED DESCRIPTION OF THE INVENTION

Figure 1A:
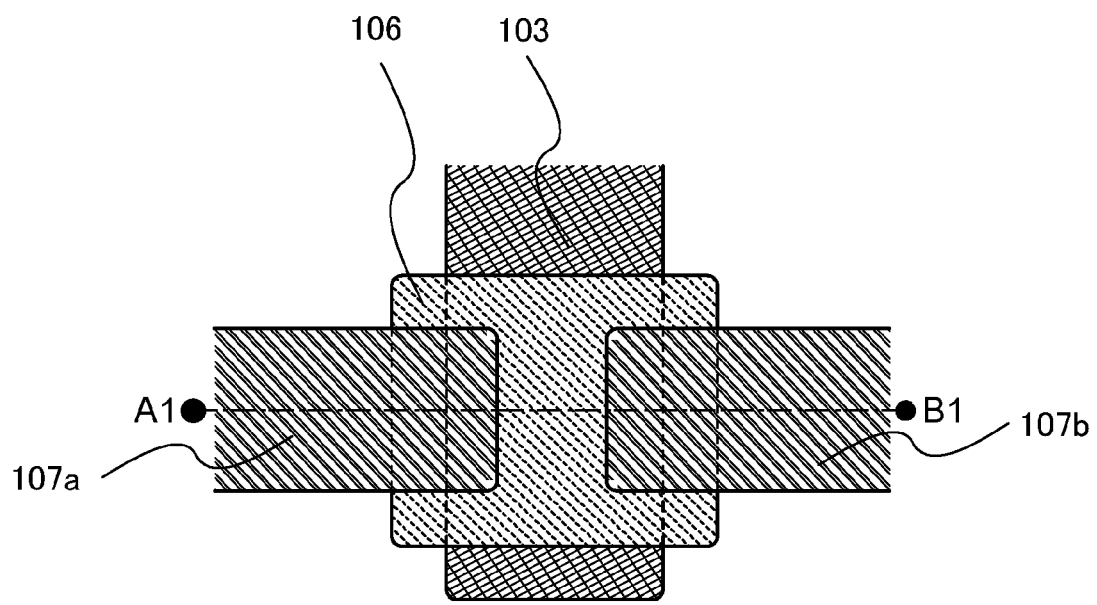
FIGS. 1A and 1B are a top view and a cross-sectional view of a semiconductor device (a transistor).

Hereinafter, embodiments of the present invention will be described in detail with reference to the accompanying drawings. However, the present invention is not limited to the following description and it is easily understood by those skilled in the art that the mode and details can be variously changed without departing from the spirit and the scope of the present invention. Therefore, the invention should not be construed as being limited to the description of the embodiments below. In describing structures of the present invention with reference to the drawings, components common between different drawings maintain the same reference numerals. The same hatching pattern is applied to similar parts, and the similar parts are not especially denoted by reference numerals in some cases. In addition, an insulating layer is not illustrated in a top view for convenience in some cases. Note that the size, the layer thickness, or the region of each structure illustrated in the drawings might be exaggerated for the sake of clarity. Therefore, the present invention is not necessarily limited to the illustrated scales.

Note that when it is described that "A and B are connected to each other", the case where A and B are electrically connected to each other, and the case where A and B are directly connected to each other are included. Here, each of A and B refers to an object (e.g., a device, an element, a circuit, a wiring, an electrode, a terminal, a conductive film, or a layer).

Note that, functions of "source" and "drain" in a transistor might be interchanged in the case where the direction of a current flow is changed in circuit operation, for example. Therefore, the terms "source" and "drain" can be replaced with each other in this specification.

Embodiment 1

In this embodiment, a semiconductor device which is one embodiment of the present invention is described with reference to FIGS. 1A and 1B. Note that while a transistor is illustrated as an example of the semiconductor device in FIGS. 1A and 1B, one embodiment of the present invention can be similarly implemented using a diode and the like.

FIG. 1A is a top view of a transistor. FIG. 1B is a cross sectional view taken along line A1-B1 in FIG. 1A. The transistor includes, over a substrate 101, a base insulating layer 102, a gate electrode layer 103, a gate insulating layer 104, an oxide semiconductor layer 106 where a channel region is formed, a source electrode layer 107a and a drain electrode layer 107b, and an insulating layer 108 which covers the oxide semiconductor layer 106, the source electrode layer 107a, and the drain electrode layer 107b.

Figure 1B:
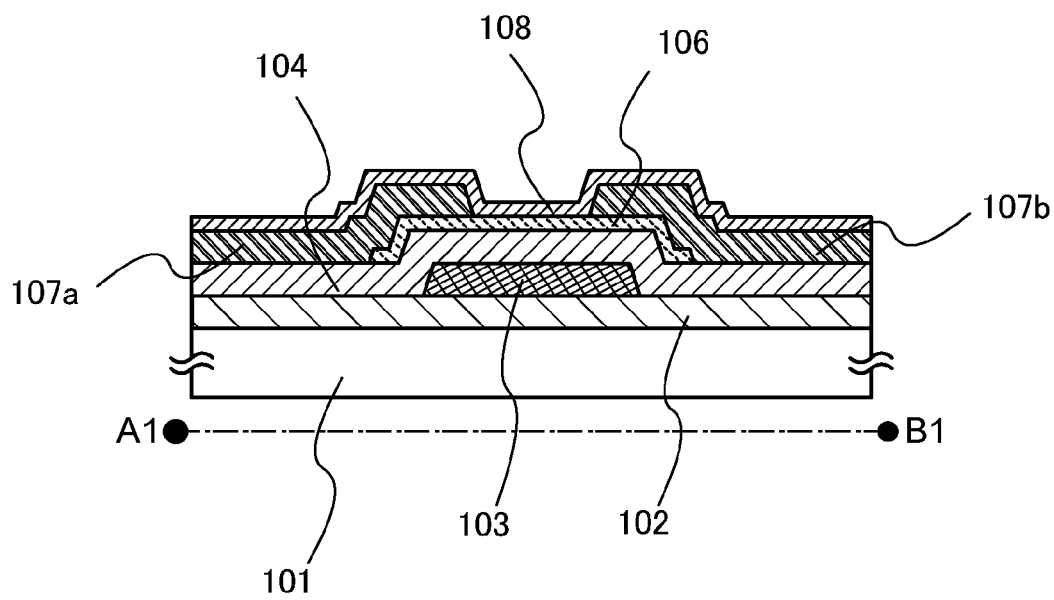

The transistor in FIGS. 1A and 1B is a transistor having a bottom-gate structure, in which the oxide semiconductor layer 106 is provided to overlap the gate electrode layer 103 with the gate insulating layer 104 interposed therebetween. Further, the transistor in FIGS. 1A and 1B has a top-contact structure where the source electrode layer 107a and the drain electrode layer 107b are provided in contact with part of an upper surface of the oxide semiconductor layer 106.

As a transistor having the bottom-gate structure, a transistor having a bottom-contact structure can be given in which a source electrode layer and a drain electrode layer are formed in contact with part of a lower surface of a semiconductor layer where a channel region is formed, in addition to a transistor having the top-contact structure. Although the transistor having the top-contact structure is described in this embodiment, one embodiment of the present invention can be implemented using a transistor having a bottom-contact structure according to this embodiment.

In the transistor in FIGS. 1A and 1B, part of an upper surface of the gate insulating layer 104 is in contact with the lower surface of the oxide semiconductor layer 106. Hence, in a process of manufacturing the transistor, the hydrogen content of the oxide semiconductor layer 106 is increased by diffusion of hydrogen into the oxide semiconductor layer 106 if a large amount of hydrogen is present in the gate insulating layer 104. The increase in the hydrogen content of the oxide semiconductor layer 106 causes an increase in carrier in the oxide semiconductor layer 106. Accordingly, the threshold voltage ($V_{th}$) value of the transistor shifts in the negative direction, and electrical characteristics of the transistor becomes unfavorable where drain current flows even when a potential of a gate electrode is equal to a potential of a source electrode ($V_{gs}$=0 V).

In order to remove diffused hydrogen from the oxide semiconductor layer 106, a method where the oxide semiconductor layer 106 is subjected to heat treatment can be given. However, the number of steps for manufacturing a transistor increases in such a method, which could lead to higher cost and a lower yield. In addition, heat treatment at approximately 400° C. has proven to be insufficient.

The inventors of the present invention have found that when the gate insulating layer 104 which is in contact with the oxide semiconductor layer 106 has a hydrogen concentration less than $6 \times 10^{20}$ atoms/cm³, preferably less than or equal to $2 \times 10^{20}$ atoms/cm³, and more preferably less than or equal to $5 \times 10^{19}$ atoms/cm³, and a halogen concentration greater than or equal to $1 \times 10^{19}$ atoms/cm³ and preferably greater than or equal to $1 \times 10^{20}$ atoms/cm³, effects that movement of hydrogen from the gate insulating layer 104 to the oxide semiconductor layer 106 is reduced and the hydrogen in the oxide semiconductor layer 106 is inactivated or released from the oxide semiconductor layer 106 can be obtained, whereby the hydrogen content of the oxide semiconductor layer 106 can be reduced.

In other words, by using a gate insulating layer having the above hydrogen concentration and the above halogen concentration as the gate insulating layer 104 which is in contact with the oxide semiconductor layer 106, a transistor having good electrical characteristics can be provided without increasing the number of steps for manufacturing the transistor. In particular, a transistor with practical reliability and characteristics can be formed while the highest temperature of the process is lower than 400° C., preferably lower than or equal to 350° C. It is needless to say that the highest temperature of the process does not limit the implementation of the present invention; the highest temperature of the process may be higher than or equal to 400° C.

The insulating layer 108 which covers the oxide semiconductor layer 106, the source electrode layer 107a, and the drain electrode layer 107b is in contact with part of the upper surface of the oxide semiconductor layer 106. Therefore, when the insulating layer 108 has a hydrogen concentration less than $6 \times 10^{20}$ atoms/cm³, preferably less than or equal to $2 \times 10^{20}$ atoms/cm³, and more preferably less than or equal to $5 \times 10^{19}$ atoms/cm³, and a halogen concentration greater than or equal to $1 \times 10^{19}$ atoms/cm³ and preferably greater than or equal to $1 \times 10^{20}$ atoms/cm³, movement of hydrogen from the insulating layer 108 to the oxide semiconductor layer 106 is reduced and the hydrogen in the oxide semiconductor layer 106 can be inactivated or released from the oxide semiconductor layer 106, and thus the hydrogen content of the oxide semiconductor layer 106 can be reduced and a semiconductor device having good electrical characteristics can be provided.

There is no particular limitation on the substrate 101 as long as it can withstand a later manufacturing process. Examples of the substrate that can be used as the substrate 101 include an insulating substrate such as a glass substrate, a ceramic substrate, a quartz substrate, or a sapphire substrate; a semiconductor substrate formed of a semiconductor material such as silicon; a conductive substrate formed of a conductor such as metal or stainless steel; and a semiconductor substrate or conductive substrate whose surface is covered with an insulating material. Alternatively, a plastic substrate can be used as appropriate.

As for a glass substrate, a substrate having a strain point higher than or equal to 730° C. is preferred in the case where heat treatment at a temperature higher than or equal to 600° C. is performed in the manufacturing process of the transistor. For example, a glass material such as aluminosilicate glass, aluminoborosilicate glass, or barium borosilicate glass is used.

The base insulating layer 102 can not only prevent diffusion of an impurity element from the substrate 101, but also prevent etching of the substrate in an etching step in the manufacturing process of the transistor. This is why the thickness of the base insulating layer 102 is preferably, but not limited to, 50 nm or more.

The base insulating layer 102 is formed to have a single-layer structure or a stacked-layer structure of two or more layers, using an insulating layer including silicon oxide, silicon oxynitride, silicon nitride, silicon nitride oxide, hafnium oxide, aluminum oxide, tantalum oxide, or the like.

Here, silicon oxynitride refers to the one that contains more oxygen than nitrogen and, for example, silicon oxynitride includes at least oxygen, nitrogen, and silicon at concentrations ranging from greater than or equal to 50 atomic % and less than or equal to 70 atomic %, greater than or equal to 0.5 atomic % and less than or equal to 15 atomic %, and greater than or equal to 25 atomic % and less than or equal to 35 atomic %, respectively. Further, silicon nitride oxide refers to the one that contains more nitrogen than oxygen and, for example, silicon nitride oxide includes at least oxygen, nitrogen, and silicon at concentrations ranging from greater than or equal to 5 atomic % and less than or equal to 30 atomic %, greater than or equal to 20 atomic % and less than or equal to 55 atomic %, and greater than or equal to 25 atomic % and less than or equal to 35 atomic %, respectively.

The above ranges are obtained by measurement using Rutherford backscattering spectrometry (RBS) or Hydrogen forward scattering (HFS). The total percentage of the constituent elements does not exceed 100 atomic %.

The gate electrode layer 103 is formed over the base insulating layer 102. For the gate electrode layer 103, any of a metal material such as molybdenum, titanium, chromium, tantalum, tungsten, platinum, palladium, or osmium, an alloy material that contains any of these metal materials as a main component, and a nitride of any of these metal materials is used to form a single layer or stacked layers. Note that the above metal material may be aluminum or copper if it can withstand the temperature of heat treatment performed in a later step. Aluminum or copper is preferably used in combination with a refractory metal material so as to avoid problems of heat resistance and corrosion. As the refractory metal material, molybdenum, titanium, chromium, tantalum, tungsten, neodymium, scandium, or the like can be used.

The gate electrode layer 103 is not limited to a single layer and may be stacked layers of two or more layers including different materials. The gate electrode layer 103 having a stacked-layer structure preferably has a two-layer structure in which a molybdenum film is stacked over an aluminum film, a two-layer structure in which a molybdenum film is stacked over a copper film, a two-layer structure in which a titanium nitride film or a tantalum nitride film is stacked over a copper film, or a two-layer structure in which a titanium nitride film and a molybdenum film are stacked. Further, the gate electrode layer 103 having a stacked-layer structure preferably has a structure where an aluminum film, an alloy film of aluminum and silicon, an alloy film of aluminum and titanium, or an alloy film of aluminum and neodymium is included as a middle layer, and a tungsten film, a tungsten nitride film, a titanium nitride film, or a titanium film is provided over and under the middle layer.

Further, for the gate electrode layer 103, polycrystalline silicon or an oxide conductor having a light-transmitting property such as indium oxide, an alloy of indium oxide and tin oxide, an alloy of indium oxide and zinc oxide, zinc oxide, aluminum zinc oxide, aluminum zinc oxynitride, or gallium zinc oxide can be used.

Further, oxynitride such as In—O—N-based oxynitride, In—Zn—O—N-based oxynitride, In—Ga—O—N-based oxynitride, or In—Ga—Zn—O—N-based oxynitride may be used for the gate electrode layer 103. Here, for example, In—Ga—Zn—O—N-based oxynitride is oxynitride which includes at least In, Ga, and Zn without particular limitation on the composition ratio. In addition, In—Ga—Zn—O—N-based oxynitride may contain another element in addition to In, Ga, and Zn.

The thickness of the gate electrode layer 103 is not particularly limited and can be determined as appropriate in consideration of electrical resistance of the conductive film formed with a metal material, an alloy material, or another compound and the time the formation step takes. For example, the gate electrode layer 103 can be formed to a thickness of 10 nm to 500 nm.

The gate insulating layer 104 is provided covering the gate electrode layer 103. Since the gate insulating layer 104 is in contact with the oxide semiconductor layer 106 as described above, the gate insulating layer 104 preferably has a hydrogen concentration less than $6 \times 10^{20}$ atoms/cm$^3$, preferably less than or equal to $2 \times 10^{20}$ atoms/cm$^3$, and more preferably less than or equal to $5 \times 10^{19}$ atoms/cm$^3$, and a fluorine concentration greater than or equal to $1 \times 10^{19}$ atoms/cm$^3$ and preferably greater than or equal to $1 \times 10^{20}$ atoms/cm$^3$.

With the above concentrations, movement of hydrogen from the gate insulating layer 104 to the oxide semiconductor layer 106 is reduced and hydrogen in the oxide semiconductor layer 106 is inactivated or released from the oxide semiconductor layer 106. Thus, the hydrogen content of the oxide semiconductor layer 106 can be reduced. The thickness of the gate insulating layer 104 can be determined as appropriate in consideration of the breakdown voltage or the manufacturing process of the transistor.

While the gate insulating layer 104 may employ any of the examples of the base insulating layer 102 as long as it has the above hydrogen concentration and the fluorine concentration, a silicon oxide layer formed by a plasma enhanced chemical vapor deposition (plasma CVD) method is described in this embodiment.

A plasma CVD method refers to a method where a film is formed by supplying a deposition gas, which is a raw material, to a reaction chamber in a plasma CVD apparatus and by using plasma energy. A plasma CVD method can provide a film having better step coverage than a film formed by, for example, a sputtering method.

Examples of a plasma CVD apparatus include a capacitively coupled high-frequency plasma CVD apparatus with a high-frequency power source, an inductively coupled high-frequency plasma CVD apparatus, a microwave plasma CVD apparatus (an electron cyclotron resonant plasma CVD apparatus) which has magnetron that is a microwave generation source and generates plasma with a microwave, a helicon wave plasma CVD apparatus, and the like. For a plasma CVD method in this specification, a CVD apparatus in which glow discharge plasma is utilized for film formation can be used as appropriate. Further, a plasma CVD method can be performed while a substrate is heated.

In the formation of the silicon oxide layer, a gas which does not include hydrogen in its compositional formula needs to be selected as a deposition gas, which is a raw material. In other words, instead of silane (SiH$_4$), silicon fluoride (e.g., SiF$_4$) or silicon chloride (SiCl$_4$) is used as the deposition gas. Further, nitrous oxide (N$_2$O) or oxygen with a low hydrogen content and a low water content is used as a gas for oxidation. Also, as another gas added for plasma stabilization such as argon, a gas with a low hydrogen content and a low water content is used.

In the formation of the silicon oxide layer by a plasma CVD method, after impurities such as hydrogen and water which remain in the reaction chamber of the plasma CVD apparatus or attached to an inner wall of the reaction chamber are removed, the silicon oxide layer is formed using the above gases while the inner wall of the reaction chamber is heated. In the case where silicon fluoride is used as a deposition gas, in particular, the gate insulating layer 104 can have a hydrogen concentration less than $6 \times 10^{20}$ atoms/cm$^3$, preferably less than or equal to $2 \times 10^{20}$ atoms/cm$^3$, and more preferably less than or equal to $5 \times 10^{19}$ atoms/cm$^3$, and a fluorine concentration greater than or equal to $1 \times 10^{19}$ atoms/cm$^3$ and preferably greater than or equal to $1 \times 10^{20}$ atoms/cm$^3$.

Further, in the case where the gate insulating layer includes two or more layers, it is possible to prevent etching of the gate electrode layer 103, which might occur because of fluorine generated in the formation of the silicon oxide layer containing fluorine over the gate electrode layer 103. In that case, a first gate insulating layer which is in contact with the gate electrode layer 103 preferably has a fluorine concentration less than $1 \times 10^{19}$ atoms/cm$^3$.

Like the above silicon oxide layer formed using silicon tetrafluoride, a second gate insulating layer which is in contact with the oxide semiconductor layer 105 needs to be an insulating layer having a fluorine concentration greater than or equal to $1 \times 10^{19}$ atoms/cm$^3$, preferably greater than or equal to $1 \times 10^{20}$ atoms/cm$^3$. Further, the first gate insulating layer is preferably formed to a thickness with which the first gate insulating layer can be prevented from being eliminated when a silicon oxide layer is formed as the second gate insulating layer using a silicon tetrafluoride or the like. For example, as the first gate insulating layer, an insulating layer given as an example for the base insulating layer 102 can be used.

The oxide semiconductor layer 106 where a channel region is formed is formed on and in contact with the gate insulating layer 104. The thickness of the oxide semiconductor layer 106 is 10 nm to 300 nm, preferably 20 nm to 100 nm.

The oxide semiconductor layer 106 is formed using an In—Ga—Zn—O-based oxide which contains In, Ga, and Zn. The oxide semiconductor layer 106 can be formed using any of the following oxide semiconductors: four-component metal oxide such as In—Sn—Ga—Zn—O-based metal oxide; three-component metal oxide such as In—Sn—Zn—O-based metal oxide, In—Al—Zn—O-based metal oxide, Sn—Ga—Zn—O-based metal oxide, Al—Ga—Zn—O-based metal oxide, and Sn—Al—Zn—O-based metal oxide; two-component metal oxide such as In—Zn—O-based metal oxide, In—Ga—O-based metal oxide, Sn—Zn—O-based metal oxide, Al—Zn—O-based metal oxide, Zn—Mg—O-based metal oxide, Sn—Mg—O-based metal oxide, and In—Mg—O-based metal oxide; indium oxide; tin oxide; zinc oxide; and the like. Here, for example, In—Ga—Zn—O-based oxide refers to oxide containing at least In, Ga, and Zn, and there is no particular limitation on the composition ratio.

In addition, the In—Ga—Zn—O-based oxide may contain another element in addition to In, Ga, and Zn.

The oxide semiconductor layer 106 can be formed using oxide represented by the chemical formula InMO$_3$(ZnO)$_m$ (m>0). Here, M denotes one or more of metal elements selected from Ga, Al, Mn, and Co. For example, M can be Ga, Ga and Al, Ga and Mn, Ga and Co, or the like.

The source electrode layer 107a and the drain electrode layer 107b are formed in contact with the gate insulating layer 104 and the oxide semiconductor layer 106. The material and the thickness of the source electrode layer 107a and the drain electrode layer 107b can be similar to those of the gate electrode layer 103.

The insulating layer 108 functioning as a passivation film or an interlayer insulating film is formed on and in contact with the source electrode layer 107a, the drain electrode layer 107b, and the oxide semiconductor layer 106. The insulating layer 108 can be formed in a manner similar to that of the gate insulating layer 104. Since the insulating layer 108 is in contact with part of the upper surface of the oxide semiconductor layer 106, when the insulating layer 108 is a silicon oxide layer as the gate insulating layer 104, movement of hydrogen from the insulating layer 108 to the oxide semiconductor layer 106 is reduced and hydrogen in the oxide semiconductor layer 106 is inactivated or released from the oxide semiconductor layer 106. Thus, the hydrogen content of the oxide semiconductor layer 106 can be reduced.

As in the case of the gate insulating layer 104, the thickness of the insulating layer 108 may be determined as appropriate in consideration with the fact that the source electrode layer 107a and the drain electrode layer 107b might be etched because of fluorine contained in the deposition gas.

The insulating layer 108 can be formed by a method which can reduce the hydrogen content of the insulating layer 108. For example, silicon oxide or the like may be deposited by a sputtering method. Silicon oxide can be deposited using a silicon target, a silicon oxide target, or the like. Preferably, a silicon oxide target is used, more preferably, a silicon oxide target whose hydroxyl concentration is less than or equal to 1000 ppm or whose hydrogen concentration is less than or equal to $3.5 \times 10^{19}$ atoms/cm$^3$ is used. A gas supplied for the deposition is a rare gas such as argon and oxygen. In addition, as the gas supplied for the deposition, it is preferable to use a high-purity gas from which impurities such as hydrogen, water, hydroxyl, or hydride are removed to 1 ppm or less, preferably 1 ppb or less.

An effect of inactivation of hydrogen in the oxide semiconductor layer 106 or release of hydrogen from the oxide semiconductor layer 106 by fluorine is described below using quantum chemistry calculation. For the quantum chemistry calculation described below, a density functional theory (DFT) with a Gaussian base is used. In the density functional theory, an exchange-correlation interaction is approximated by a functional of one electron potential represented in terms of electron density; thus, the calculations can be performed with high speed and high accuracy. In this embodiment, B3LYP which is a hybrid functional is used to specify the weight of parameters related to exchange and correlation energy.

In addition, a basis function applied to all atoms is 6-311G, which is a basis function of a triple-split valence basis set using three contraction functions for each valence orbital. By this basis functions, orbits of is to 3s are considered for hydrogen atoms while orbits of is to 4s and 2p to 4p are considered for oxygen atoms. Furthermore, to improve calculation accuracy, the p function and the d function as polarization basis sets are used respectively for hydrogen atoms and atoms other than hydrogen atoms. In addition, Gaussian 09, which is produced by CONFLEX Corporation, is used as a program for the quantum chemistry calculation.

In this embodiment, a hydrogen atom in the oxide semiconductor layer 106 is bonded to an oxygen atom or a metal atom; thus, a structure including hydrogen in the oxide semiconductor layer 106 is assumed to be either Structural Formulae (α-1) and (α-2) illustrated below. In Structural Formulae (α-1) and (α-2) illustrated below, a coordinate bond is not taken into account and only an ionic bond is taken into account. While the oxide semiconductor layer 106 in this embodiment is formed using the above oxide semiconductor containing In (indium), Ga (gallium), and Zn (zinc), the metal atom in following Structural Formulae (α-1) and (α-2) is Ga (gallium).

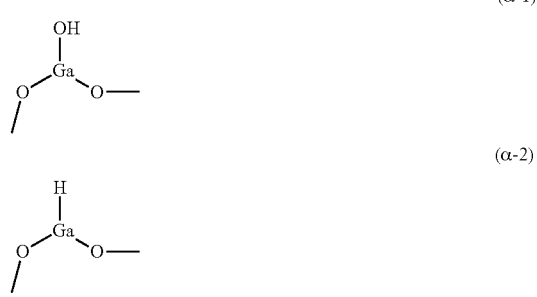

The reactions represented by Formula 1 and Formula 2 are given as reaction processes of a fluorine atom and hydrogen which is in the oxide semiconductor layer 106.

Ga—OH+F.→HF+Ga—O. (Formula 1)

Ga—H+F.→HF+Ga. (Formula 2)

In Formula 1, a fluorine radical reacts with a hydrogen atom of hydroxyl to form an HF (hydrogen fluoride) molecule. In Formula 2, a fluorine radical reacts with a hydrogen atom bonded to a gallium atom to form an HF (hydrogen fluoride) molecule. Note that the symbol "." in Formula 1 and Formula 2 represents a radical.

Figure 2A:
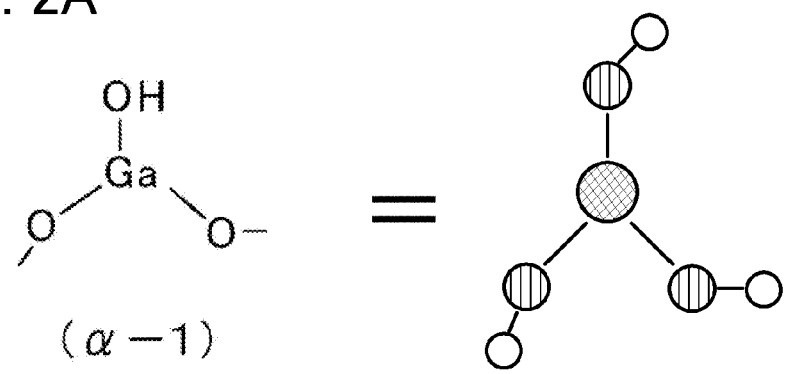
FIGS. 2A and 2B each illustrate cluster models in which a gallium atom is at the center.
Figure 2B:
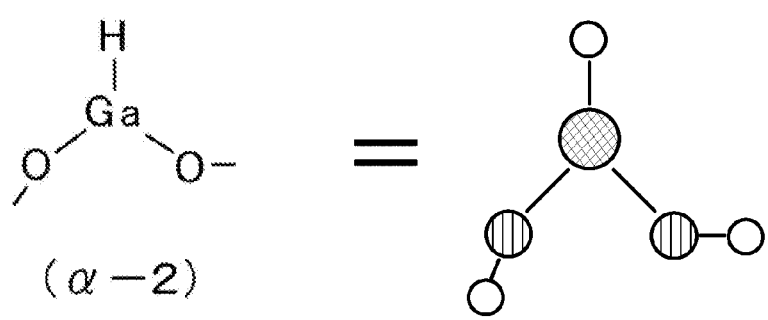

In the quantum chemistry calculation here, with simple cluster models illustrated in FIGS. 2A and 2B for the above Structural Formulae (α-1) and (α-2), activation energy in the above reactions are calculated to estimate the probability of the reactions.

Figure 3A:
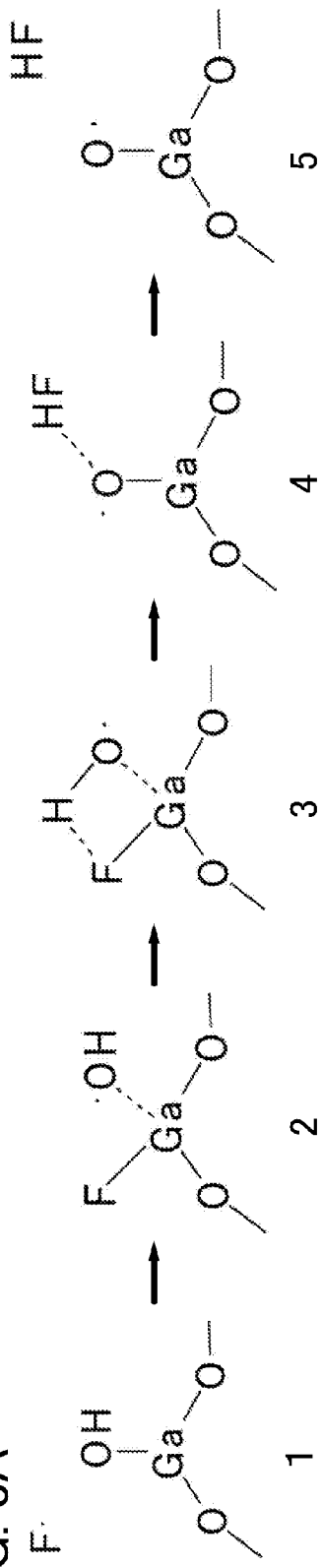
FIGS. 3A and 3B illustrate reaction formulae and an energy diagram of a reaction for releasing a hydrogen atom.
Figure 3B:
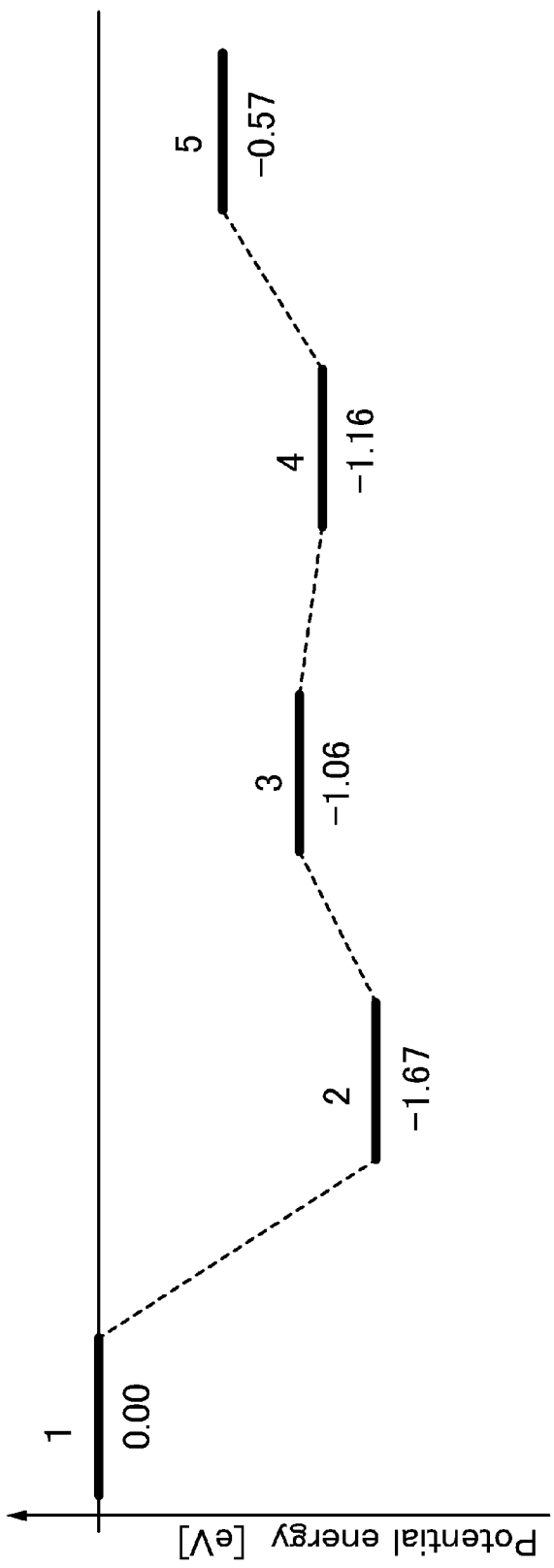

The quantum chemistry calculation of the reaction in Formula 1 is made and a reaction pathway which is analyzed and an energy diagram are illustrated in FIGS. 3A and 3B.

In FIGS. 3A and 3B, Initial State 1 is a state where hydroxyl and fluorine radical are infinitely far from each other. In the energy diagram, the energy of Initial State 1 is a baseline. In Intermediate 2, the fluorine radical approaches to a gallium atom, whereby a Ga—O bond is broken, a hydroxyl radical is generated, and a Ga—F bond is formed. By such a reaction, the potential energy of Intermediate 2 becomes −1.67 eV.

In Intermediate 3, the hydrogen atom of the hydroxyl radical is bonded to the fluorine atom to generate an HF molecule. The activation energy, which is a difference between the potential energies of Intermediate 2 and Intermediate 3, is calculated as 0.61 eV. In Intermediate 4, an oxygen radical and the HF molecule interact with each other. In Final State 5, the oxygen radical and the HF molecule are infinitely far from each other.

In practice, HF may be released from the oxide semiconductor layer 106, but may remain in the oxide semiconductor layer 106 for some reason. If HF remains in the oxide semiconductor layer 106, hydrogen in the HF molecular is not bonded to the oxide semiconductor (i.e., hydrogen is inactivated) and thus does not function as a carrier source in the oxide semiconductor.

The break in the Ga—O bond and the formation of the Ga—F bond in Intermediate 2 which are caused by the approach of the fluorine radical to the gallium atom are due to the fact that the bond energy of the Ga—O bond is 4.37 eV and the bond energy of the Ga—F bond is 5.31 eV.

Figure 4A:
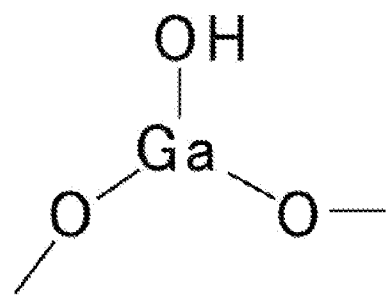
FIGS. 4A to 4D illustrate models used for calculation of bond energy.
Figure 4B:
Figure 4B:
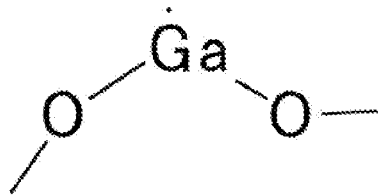
Figure 4C:
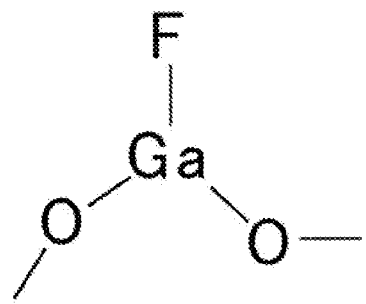
Figure 4D:
Figure 4D:
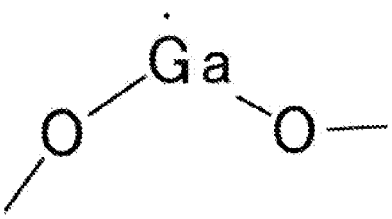

The bond energy of the Ga—O bond here is a value obtained by calculating the difference between the potential energy of the state where hydroxyl is bonded to a gallium atom (see FIG. 4A) and the potential energy of the state where a hydroxyl radical is infinitely far away (see FIG. 4B). The bond energy of the Ga—F bond here is a value obtained by calculating the difference between the potential energy of the state where fluorine is bonded to a gallium atom (see FIG. 4C) and the state where a fluorine radical is infinitely far away (see FIG. 4D).

The difference between the energies of Initial State 1 and Final State 5 reveals that the reaction represented in Formula 1, where hydrogen in the oxide semiconductor layer 106 and fluorine are combined with each other, is an exothermic reaction. Therefore, it can be said that this reaction proceeds easily.

Then, the quantum chemistry calculation of the reaction in Formula 2 is made and a reaction pathway which is analyzed and an energy diagram are illustrated in FIGS. 5A and 5B.

In FIGS. 5A and 5B, Initial State 1 is a state where a hydrogen atom and fluorine radical are infinitely far from each other. In the energy diagram, the energy of Initial State 1 is a baseline. In Intermediate 2, the fluorine radical approaches to a gallium atom, whereby a Ga—H bond is broken, a hydrogen radical is generated, and a Ga—F bond is formed. By such a reaction, the potential energy of Intermediate 2 becomes −1.99 eV.

In Intermediate 3, the hydrogen radical is bonded to the fluorine atom to generate an HF molecule. The activation energy, which is a difference between the potential energies of Intermediate 2 and Intermediate 3, is calculated as 0.45 eV. In Intermediate 4, an oxygen atom bonded to the gallium atom and the HF molecule interact with each other. In Final State 5, the HF molecule is infinitely far away.

The break in the Ga—H bond and the formation of the Ga—F bond in Intermediate 2 which are caused by the approach of the fluorine radical to the gallium atom as in Formula 1 are, similar to the case of Formula 1, due to the fact that the Ga—F bond is more stable than the Ga—H bond in terms of bond energy.

The difference between the energies of Initial State 1 and Final State 5 reveals that the reaction illustrated in Formula 2, in which hydrogen in the oxide semiconductor layer 106 is released, is also an exothermic reaction. Therefore, it can be said that the hydrogen release reaction proceeds easily.

As described above, hydrogen in the oxide semiconductor layer 106 can be inactivated or released from the oxide semiconductor layer 106 by fluorine.

Next, a manufacturing method of a semiconductor device in FIGS. 1A and 1B will be described with reference to FIGS. 6A to 6D.

The base insulating layer 102 is formed over the substrate 101. The substrate 101 and the base insulating layer 102 can be as described above, and a glass substrate is used as the substrate 101 in this embodiment. Although the base insulating layer 102 may be formed by a plasma CVD method, the base insulating layer 102 in this manufacturing method is a silicon oxide layer formed to a thickness of 200 nm by an RF sputtering method using silicon oxide as a target and a rare gas such as argon and oxygen as gases that are supplied for the formation.

Then, a conductive film serving as the gate electrode layer 103 is formed. As the conductive film, in this manufacturing method of a semiconductor device, a 150-nm-thick titanium film is formed by a DC sputtering method using a titanium target. Then, a first photolithography step and an etching step are performed, whereby the gate electrode layer 103 having a thickness of 150 nm is formed.

Either wet etching or dry etching may be used for the etching of the conductive film. Note that dry etching is preferable in terms of microfabrication of the element. An etching gas and an etchant can be selected as appropriate to be suitable for a material to be etched.

The gate electrode layer 103 preferably has a tapered shape. This is because an oxide semiconductor film and a conductive film that is to be the source electrode layer and the drain electrode layer are formed over the gate electrode layer 103 in later steps and the taper shape is effective in preventing breakage of those wirings at the step of the gate electrode layer 103. In order to form the gate electrode layer 103 to have a tapered shape, etching may be performed while the resist mask is made to recede.

Next, the gate insulating layer 104 is formed by a plasma CVD method. The inner wall of a reaction chamber in a plasma CVD apparatus is heated, so that impurities are released from the inner wall of the reaction chamber. After that, impurities remaining in the reaction chamber or released from the inner wall of the reaction chamber are removed by plasma cleaning using a fluorine compound such as nitrogen trifluoride ($NF_3$). In this embodiment, a capacitively-coupled plasma CVD apparatus using a high-frequency power source is used.

The temperature at which the inner wall of the reaction chamber in the plasma CVD apparatus is heated is higher than or equal to 100° C. and lower than or equal to 350° C., preferably higher than or equal to 100° C. and lower than or equal to 125° C., and this heating step is performed at least for 30 minutes or more, preferably 60 minutes or more. Here, the heating step can be carried out while evacuation is performed.

There is no particular limitation on the method of the above plasma cleaning. In this manufacturing method of a semiconductor device, although the cleaning method in which plasma is generated in the reaction chamber where the cleaning is performed is given as an example, remote plasma cleaning may be performed in which plasma is generated in advance outside the reaction chamber where the cleaning is performed, and the generated plasma is supplied to the reaction chamber for cleaning.

The plasma cleaning in this manufacturing method of a semiconductor device includes a plasma treatment step and an evacuation step. Specific preferred conditions for the plasma cleaning are that nitrogen trifluoride is supplied to the reaction chamber at a flow rate of 400 sccm to 2000 sccm, the pressure in the reaction chamber is adjusted to 10 Pa to 200 Pa, the distance between electrodes is adjusted to 15 mm to 60 mm, a power of 500 W to 2000 W (1 W/cm$^2$ to 4 W/cm$^2$ as a power per unit electrode area (as a power density)) is output with a high-frequency power source at 13.56 MHz to 60 MHz so that plasma is generated, and the treatment time is 5 minutes to 10 minutes. More preferred conditions for the plasma cleaning are that nitrogen trifluoride is supplied to the reaction chamber at a flow rate of 600 sccm, the pressure in the reaction chamber is adjusted to about 70 Pa, the distance between electrodes is adjusted to 50 mm, and a power of 900 W (about 1.8 W/cm$^2$ in units of power densities) is output with a high-frequency power source at 60 MHz for 7 minutes.

Figure 6A:
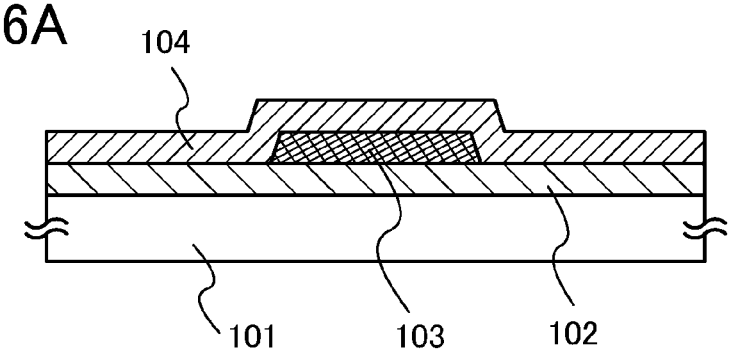
FIGS. 6A to 6D are cross-sectional views illustrating a manufacturing method of a transistor.

Then, silicon tetrafluoride as the deposition gas, nitrous oxide as the gas for oxidation, and argon as the additional gas are supplied to the reaction chamber, and a silicon oxide film is formed to a thickness of 200 nm using plasma energy. Further, when the gate insulating layer 104 has two layers, a 150-nm-thick silicon oxide film, for which silane is used as the deposition gas may be formed as the first gate insulating layer in contact with the gate electrode layer 103, and a 50-nm-thick silicon oxide film, for which silicon tetrafluoride is used as the deposition gas may be formed as the second gate insulating layer in contact with the oxide semiconductor layer 105. A structure obtained through the steps up to this point is illustrated in FIG. 6A.

Next, a 50-nm-thick oxide semiconductor film is formed by a DC sputtering method. Since the oxide semiconductor film is formed in contact with the gate insulating layer 104, fluorine contained in the gate insulating layer 104 inactivates hydrogen in the oxide semiconductor film or releases hydrogen from the oxide semiconductor film. Further, oxygen is supplied from the gate insulating layer 104 to a defect in the oxide semiconductor film. Although a DC sputtering method is used in this embodiment, a vacuum evaporation method, a pulse laser deposition method, a CVD method, or the like may be used.

In this manufacturing method of a semiconductor device, an In—Ga—Zn—O-based oxide semiconductor film which is obtained by a sputtering method using an oxide semiconductor target including indium (In), gallium (Ga), and zinc (Zn) (In$_2$O$_3$:Ga$_2$O$_3$:ZnO=1:1:1 or In$_2$O$_3$:Ga$_2$O$_3$:ZnO=1:1:2 in a molar ratio) is used. In addition, in this manufacturing method of a semiconductor device, a DC sputtering method is employed, the flow rates of argon and oxygen are respectively 30 sccm and 15 sccm.

Before the formation of the oxide semiconductor film by a sputtering method, reverse sputtering in which an argon gas is introduced and plasma is generated is preferably performed. The reverse sputtering refers to a method where plasma is generated in the vicinity of the substrate by application of a voltage to a substrate side with use of an RF power source in an atmosphere such as argon, nitrogen, or helium to modify a surface. The reverse sputtering may be performed in an atmosphere in which oxygen, nitrous oxide, or the like is added to the above atmosphere, or an atmosphere in which chlorine (Cl$_2$), carbon tetrafluoride (CF$_4$), or the like is added to the above atmosphere.

In the formation of the oxide semiconductor film, the substrate is heated to a temperature higher than or equal to 100° C. and lower than 550° C., preferably higher than or equal to 200° C. and lower than or equal to 400° C. Then, while moisture in the process chamber is removed, a sputtering gas from which hydrogen, water, or the like is removed is introduced, and the oxide semiconductor film is formed using the oxide semiconductor target. By forming the oxide semiconductor film while the substrate is heated, moisture contained in the oxide semiconductor film can be further reduced. In addition, damage due to sputtering can be reduced.

In order to remove moisture in the process chamber, an entrapment vacuum pump is preferably used. For example, a cryopump, an ion pump, a titanium sublimation pump, or the like can be used. A turbo pump provided with a cold trap may be used. By evacuation with a cryopump or the like, hydrogen, water, and the like can be removed from the process chamber and the concentration thereof in the oxide semiconductor film can be reduced.

Figure 6B:
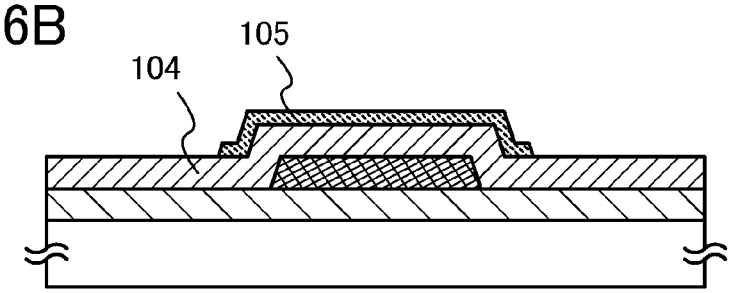

After that, a second photolithography step and an etching step are performed, whereby the oxide semiconductor layer 105 processed into an island shape is formed. A structure obtained through the steps up to this point is illustrated in FIG. 6B.

Then, the oxide semiconductor layer 105 may be subjected to heat treatment in an inert gas atmosphere (e.g., nitrogen, helium, neon, or argon), a dry atmosphere which has a dew point lower than or equal to −60° C. and a low moisture content. For example, heat treatment is performed at a temperature higher than or equal to 100° C. and lower than or equal to 400° C. for 10 minutes or more.

The heat treatment can employ a heating method using an electric furnace, a rapid heating method such as a gas rapid thermal anneal (GRTA) method using a heated gas or a lamp rapid thermal anneal (LRTA) method using lamp light, or the like. For example, in the case where an electric furnace is used for the heat treatment, it is preferable that the temperature rise characteristic is set to be greater than or equal to 0.1° C./min and less than or equal to 20° C./min and the temperature drop characteristic is set to be greater than or equal to 0.1° C./min and less than or equal to 15° C./min.

In this manufacturing method of a semiconductor device, by the heat treatment on the oxide semiconductor layer 105, the oxide semiconductor layer 106 from which moisture and hydrogen are released is formed. In this case, also, fluorine contained in the gate insulating layer 104 inactivates hydrogen in the oxide semiconductor film or releases hydrogen from the oxide semiconductor film. Further, oxygen is supplied from the gate insulating layer 104 to a defect in the oxide semiconductor layer 106.

The heat treatment can be performed in an inert gas atmosphere (e.g., nitrogen, helium, neon, or argon) by rapid thermal anneal (RTA) treatment at a temperature higher than or equal to 500° C. and lower than or equal to 750° C. (or a temperature lower than or equal to the strain point of the glass substrate) for approximately greater than or equal to 1 minute and less than or equal to 10 minutes, preferably at 600° C. for approximately greater than or equal to 3 minutes and less than or equal to 6 minutes. Note that by an RTA method, dehydration or dehydrogenation can be performed in a short time, and the treatment can be therefore performed even at a temperature higher than the strain point of the glass substrate.

In the heat treatment, it is preferable that moisture, hydrogen, and the like be not contained in the inert gas atmosphere (nitrogen or a rare gas such as helium, neon, or argon). It is preferable that nitrogen or a rare gas such as helium, neon, or argon which is introduced into a heat treatment apparatus have a purity of 6N (99.9999%) or more, preferably 7N (99.99999%) or more (i.e. an impurity concentration of 1 ppm or less, preferably 0.1 ppm or less).

Note that the above heat treatment is not necessarily performed after the formation of the island-shaped oxide semiconductor layer 105, and the heat treatment may be performed on the oxide semiconductor film before being processed into the island-shaped oxide semiconductor layer 105. Furthermore, the heat treatment may be performed more than once. The oxide semiconductor layer 106 after the heat treatment may be partly crystallized.

Figure 6C:
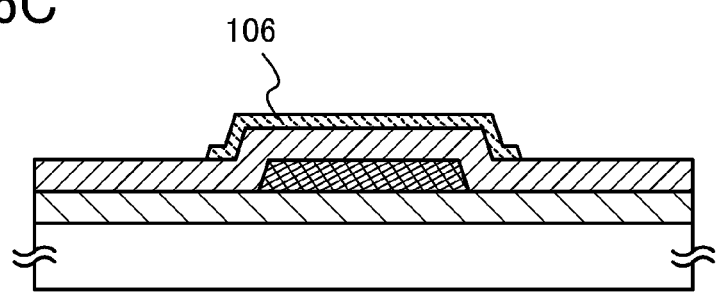

Here, an exposed surface of the oxide semiconductor layer 106 may be subjected to plasma treatment using oxygen, ozone, or nitrous oxide. The plasma treatment enables supply of oxygen to a defect in the oxide semiconductor layer 106. A structure obtained through the steps up to this point is illustrated in FIG. 6C.

Then, a conductive film is formed, and a third photolithography step and an etching step are performed, whereby the source electrode layer 107a and the drain electrode layer 107b are formed. The conductive film can be similar to the gate electrode layer 103. In this manufacturing method of a semiconductor device, a 150-nm-thick titanium film is formed by a DC sputtering method using a titanium target, and the third photolithography step and the etching step are performed, whereby the source electrode layer 107a and the drain electrode layer 107b are formed.

Figure 6D:
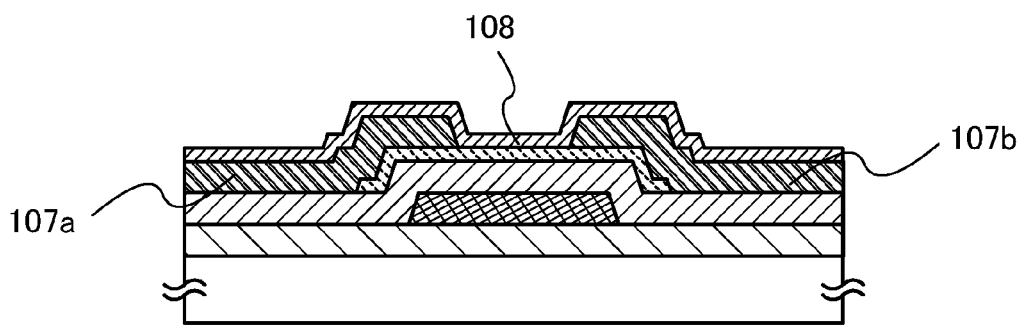

Then, the insulating layer 108 is formed. In this manufacturing method of a semiconductor device, a 50-nm-thick silicon oxide layer is formed by a method similar to that of the gate insulating layer 104, using a gas similar to that of the gate insulating layer 104. Note that heat treatment may be performed after the insulating layer 108 is formed. The heat treatment is performed in an inert gas atmosphere (e.g., nitrogen, helium, neon, or argon) and preferably at a temperature higher than or equal to 200° C. and lower than or equal to 400° C. Alternatively, the above RTA treatment may be performed. A structure obtained through the steps up to this point is illustrated in FIG. 6D.

With the structure described in this embodiment, hydrogen diffusion into the oxide semiconductor layer 106 can be reduced, and hydrogen in the oxide semiconductor layer 106 can be inactivated or released from the oxide semiconductor layer 106, whereby a semiconductor device having good electrical characteristics can be provided. Note that the structure described in this embodiment can be combined as appropriate with a structure described in any of the other embodiments in this specification.

Embodiment 2

Figure 7A:
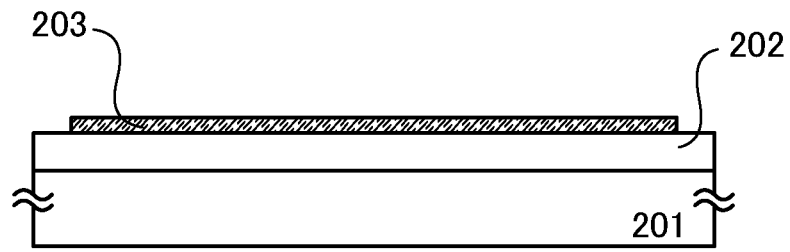
FIGS. 7A to 7C are cross-sectional views illustrating a manufacturing method of a transistor.
Figure 7B:
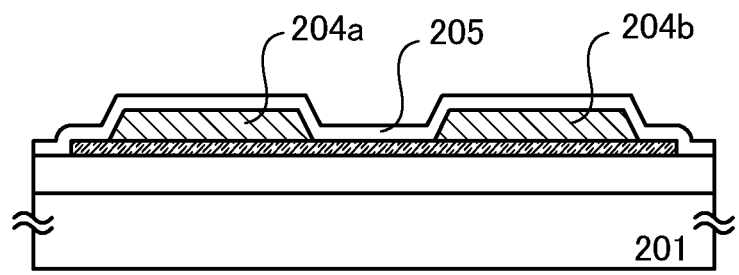
Figure 7C:
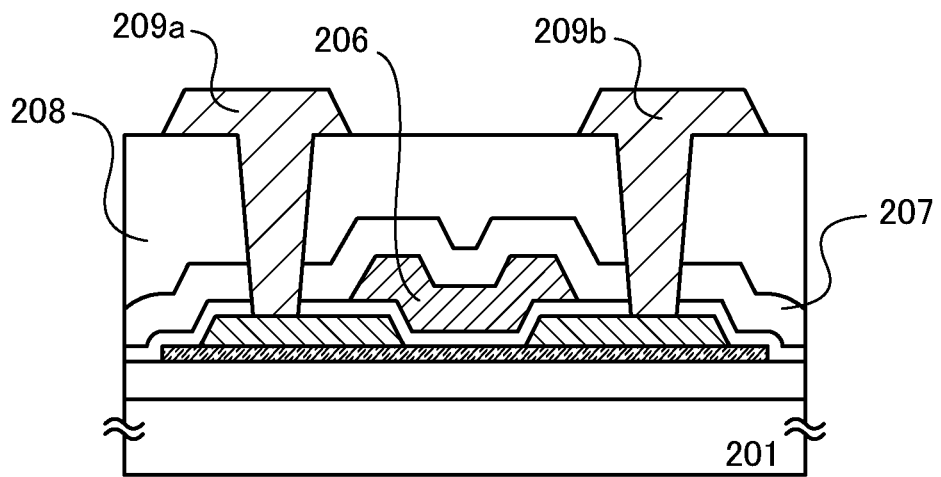

In this embodiment, an example where a silicon oxide layer with a low hydrogen concentration is used as a base insulating layer of a top-gate transistor will be described with reference to FIGS. 7A to 7C. The silicon oxide layer is formed by a plasma CVD method using silicon tetrafluoride which is a deposition gas, nitrous oxide which is an oxidizing gas, and argon which stably generates plasma.

A base insulating layer 202 including silicon oxide as its main component is formed over the substrate 201. As described above, the base insulating layer 202 is formed by a plasma CVD method using silicon tetrafluoride. For details of the formation method, a manufacturing method of the gate insulating layer 104 in Embodiment 1 may be referred to. The thickness of the base insulating layer 202 is preferably five or more times as thick as the total thickness of an oxide semiconductor layer and a gate insulating layer which are formed later.

When the base insulating layer 202 has the above thickness, an enough amount of fluorine is diffused from the base insulating layer; therefore, hydrogen in the oxide semiconductor layer and the gate insulating layer is inactivated or released from the oxide semiconductor layer and the gate insulating layer. If the thickness of the base insulating layer were less than twice the total thickness of the oxide semiconductor layer and the gate insulating layer, the amount of fluorine would be insufficient and the effect would not be obtained.

Then, an In—Ga—Zn—O-based oxide film with a thickness of 10 nm to 30 nm is formed by a sputtering method as an oxide semiconductor film. Then, the oxide semiconductor film is etched to form an island-shaped oxide semiconductor layer 203. Note that the oxide semiconductor layer 203 may be subjected to heat treatment in order to reduce a hydrogen concentration. FIG. 7A shows the state obtained thus far.

Then, a conductive film is formed to cover the base insulating layer 202 and the oxide semiconductor layer 203. The conductive film may be a multi-layer film including titanium and aluminum formed by a sputtering method. Then, the conductive film is etched to form a source electrode layer 204a and a drain electrode layer 204b. In this etching, a surface of the oxide semiconductor layer 203 may also be etched depending on the relation between the etching rate of the conductive film and the etching rate of the oxide semiconductor layer 203.

In the case where a metal material (e.g., titanium, tungsten, molybdenum, aluminum, or nitride thereof) which reacts with fluorine is used for forming bottom surfaces of the source electrode layer 204a and the drain electrode layer 204b, it is preferable that neither the source electrode layer 204a nor the drain electrode layer 204b be in contact with the base insulating layer 202.

If the source electrode layer 204a and the drain electrode layer 204b which include the above material are in contact with the base insulating layer 202, a chemical reaction will occur at the interface, which makes the source electrode layer 204a and the drain electrode layer 204b be easy to separate. Thus, as in FIG. 7B, the source electrode layer 204a and the drain electrode layer 204b are preferably provided only over the oxide semiconductor layer 203.

Note that when the bottom surfaces of the source electrode layer 204a and the drain electrode layer 204b are formed of a material like an oxide conductor, the above problem does not arise.

In addition, a gate insulating layer 205 including silicon oxynitride is formed with a thickness of 10 nm to 30 nm by a plasma CVD method to cover the base insulating layer 202, the oxide semiconductor layer 203, the source electrode layer 204a, and the drain electrode layer 204b. By a plasma CVD method, a gate insulating film with good step coverage can be obtained.

Here, it is preferable that fluorine or chlorine be not contained in a gas that is used. This is because the source electrode layer 204a and the drain electrode layer 204b may be etched in the deposition when a gas containing such a component is used.

Thus, silane and ammonia are preferably used as a deposition gas. Silicon oxynitride thus obtained contains a large amount of hydrogen, but fluorine is supplied from the base insulating layer 202 having an enough thickness as described above and thus the hydrogen is inactivated or released. FIG. 7B shows the state obtained thus far.

Then, a conductive film is formed to cover the gate insulating layer 205 and etched to form a gate electrode layer 206. The deposition for the gate insulating layer 205 and the deposition for the conductive film for forming the gate electrode layer are preferably performed successively without exposure to air.

After that, an insulating layer 207 with a thickness of 100 nm to 300 nm is formed by deposition of silicon oxide by a plasma CVD method. Then, an insulating layer 208 having a flat surface is formed using an organic resin or the like. In the deposition for the insulating layer 207, silane or TEOS (tetraethoxysilane, $Si(OC_2H_5)_4$) is preferably used as a deposition gas in order to avoid etching of the gate electrode layer 206 during the deposition.

Although the insulating layer 207 contains a large amount of hydrogen, the insulating layer 207 and the channel region of the transistor are separated by the gate electrode layer 206; therefore, the reliability is not likely to become a problem. In order to further improve the reliability and to prevent etching of the gate electrode layer 206, the insulating layer 207 may be formed to have a stacked-layer structure where a first insulating layer which is in contact with the gate electrode layer 206 is formed with a thickness of 20 nm to 100 nm using the above silane or TEOS and a second insulating layer thereover is formed using silicon fluoride (e.g., silicon tetrafluoride).

Lastly, contact holes reaching the source electrode layer 204a and the drain electrode layer 204b are formed in the gate insulating layer 205, the insulating layer 207, and the insulating layer 208, and an electrode 209a and an electrode 209b are formed. FIG. 7C shows the state obtained thus far.

Through the above process, a top-gate transistor can be formed. Although silicon fluoride is used as the deposition gas of the base insulating layer 202 in the above example, it is needless to say that silicon chloride can be used. This embodiment can be combined with any of the other embodiments.

Embodiment 3

In this embodiment, an example where a silicon oxide layer with a low hydrogen concentration which is formed by using silicon tetrafluoride as a deposition gas is used as a base insulating layer of a top-gate transistor will be described with reference to FIGS. 8A to 8D.

A base insulating layer 302 including silicon oxide as its main component is formed over the substrate 301. As described above, the base insulating layer 302 is formed by a plasma CVD method using silicon tetrafluoride. For details of the formation method, a manufacturing method of the gate insulating layer 104 in Embodiment 1 may be referred to. The thickness of the base insulating layer 302 is preferably five or more times as thick as the total thickness of an oxide semiconductor layer and a gate insulating layer which are formed later.

After that, an In—Ga—Zn—O-based film with a thickness of 10 nm to 30 nm is formed by a sputtering method as an oxide semiconductor film 303. Then, a conductive film 304 is formed to cover the oxide semiconductor film 303. The conductive film may be a tungsten film formed by a sputtering method, for example.

Figure 8A:
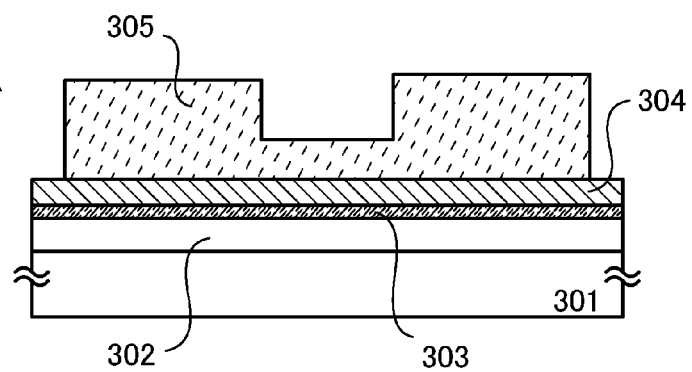
FIGS. 8A to 8D are cross-sectional views illustrating a manufacturing method of a transistor.

Then, resist is applied to the conductive film 304 and is patterned by a photolithography method with a multi-tone mask to provide a resist mask 305 having at least two different thicknesses. FIG. 8A shows the state obtained thus far.

Then, first etching is performed using the resist mask 305. For example, parts of the conductive film 304 and oxide semiconductor film 303 which are not covered with a resist mask are etched by anisotropic dry etching. By the first etching, an island-shaped oxide semiconductor layer 303a and a conductive layer 304a having a substantially same shape as the island-shaped oxide semiconductor layer 303a are obtained (see FIG. 8B).

Figure 8B:
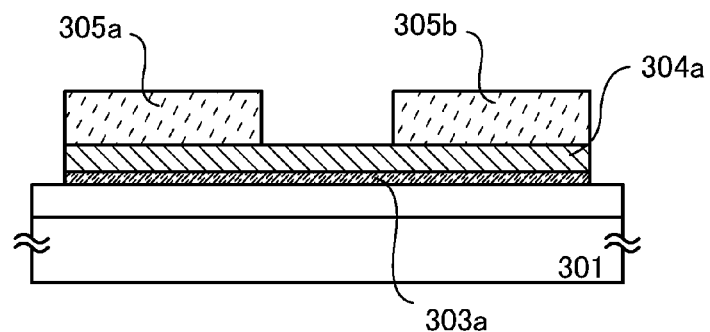

When dry etching is performed, the resist mask 305 is also etched and may be divided into two resist masks, a resist mask 305a and a resist mask 305b, as in FIG. 8B. On the other hand, when wet etching is performed, the resist mask 305 is not etched. Note that even when dry etching is performed, the resist mask 305 may hardly be etched depending on the conditions. In these cases, an ashing step is additionally provided to etch the resist mask 305 so that the resist mask 305 has the shape in FIG. 8B.

Then, second etching is performed using the two resist masks, the resist mask 305a and the resist mask 305b. In this etching, the conductive layer 304a should be etched selectively. In addition, a method where the conductive layer 304a is tapered by the etching is preferably employed. In such a manner, a source electrode layer 304b and a drain electrode layer 304c are obtained (see FIG. 8C).

Steps after the deposition for the base insulating layer 302 and up to the formation of the source and drain electrode layers 304b and 304c include only one photolithography step because of the use of a multi-tone mask. In contrast, in Embodiment 2, two photolithography steps are needed in order to form the source and drain electrode layers 204a and 204b.

In addition, while resist application on the oxide semiconductor film is needed for forming the oxide semiconductor layer 203 in Embodiment 2, resist is not applied on the oxide semiconductor film 303 or the oxide semiconductor layer 303a in this embodiment, whereby the surface of the oxide semiconductor layer 303a can be kept clean.

In addition, as is apparent from the above description of the process, the source and drain electrode layers 304b and 304c are formed only over the oxide semiconductor layer 303a and are not in contact with the base insulating layer 302.

Figure 8C:
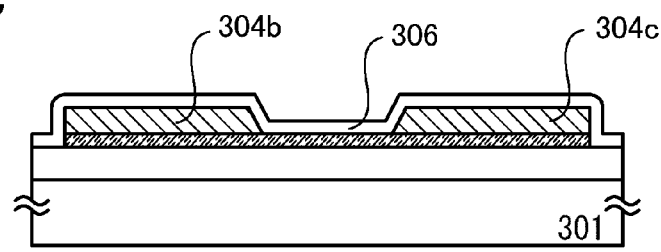

In addition, a gate insulating layer 306 including silicon oxynitride is formed with a thickness of 10 nm to 30 nm by a plasma CVD method to cover the base insulating layer 302, the oxide semiconductor layer 303a, the source electrode layer 304b, and the drain electrode layer 304c. FIG. 8C shows the state obtained thus far.

Figure 8D:
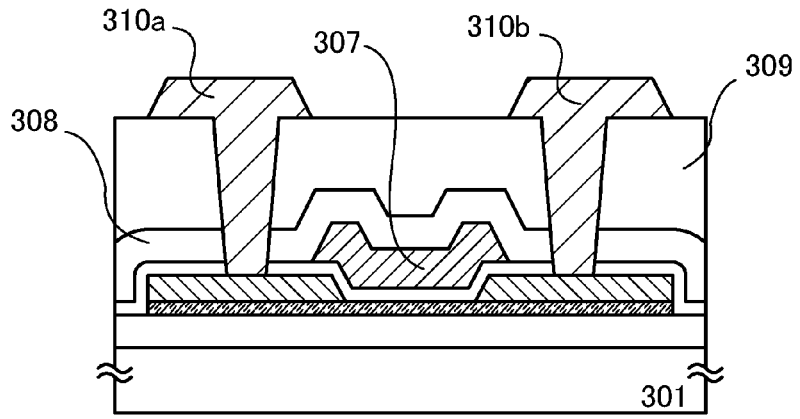

Then, a conductive film is formed to cover the gate insulating layer 306 and etched to form a gate electrode layer 307. After that, an insulating layer 308 with a thickness of 100 nm to 300 nm is formed by deposition of silicon oxide by a sputtering method. Then, an insulating layer 309 having a flat surface is formed using an organic resin or the like. Then, contact holes reaching the source electrode layer 304b and the drain electrode layer 304c are formed in the gate insulating layer 306, the insulating layer 308, and the insulating layer 309, and an electrode 310a and an electrode 310b are formed. FIG. 8D shows the state obtained thus far.

Through the above process, a top-gate transistor can be formed. Although silicon fluoride is used as the deposition gas of the base insulating layer 302 in the above example, it is needless to say that silicon chloride can be used. This embodiment can be combined with any of the other embodiments.

Embodiment 4

In this embodiment, an example where a silicon oxide layer with a low hydrogen concentration which is formed by using silicon tetrafluoride as a deposition gas is used as a base insulating layer of a top-gate transistor over a multi-layer circuit will be described with reference to FIGS. 9A to 9D.

A wiring 402a and a wiring 402b are provided over a substrate 401. The wiring 402a and the wiring 402b are not limited to just wirings and may be a gate electrode layer, source electrode, or drain electrode of a transistor over the substrate 401 or a wiring extended therefrom. In other words, a transistor including a semiconductor material such as silicon may be provided over the substrate 401.

A silicon nitride oxide film 403 is formed to cover the wirings 402a and 402b by a plasma CVD method. The silicon nitride oxide film 403 preferably contains an adequate amount of hydrogen. By the silicon nitride oxide film 403 covering the wirings 402a and 402b and the transistor over the substrate 401, hydrogen can be supplied to the transistor. When the transistor includes silicon or germanium, hydrogen can terminate dangling bonds in such a semiconductor material, whereby transistor characteristics can be favorable.

The thickness of the silicon nitride oxide film 403 is preferably determined with some points taken into consideration. First, the thickness should be determined with an effect of the above hydrogenation taken into consideration. Second, as is described later, the silicon nitride oxide film 403 also functions as an etching stopper in a planarization step, and that function should be taken into consideration. Third, in an etching step after the planarization, the silicon nitride oxide film 403 is etched together with a base insulating layer (which is formed over the silicon nitride oxide film 403); therefore, the difference in etching rates of the base insulating layer and the silicon nitride oxide film 403 should be small enough so as not to disrupt the planarity.

The thickness of the silicon nitride oxide film 403 should be large according to the above first and second points, but should be small according to the third point. Therefore, with these points taken into consideration, the thickness of the silicon nitride oxide film 403 may be, for example, 50 nm to 200 nm.

Figure 9A:
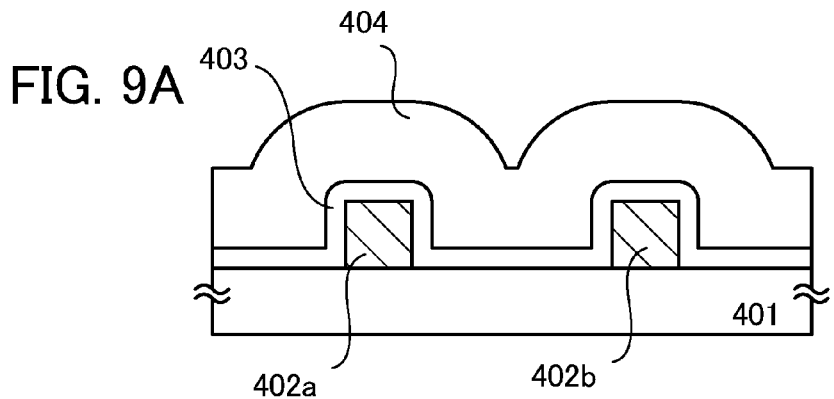
FIGS. 9A to 9D are cross-sectional views illustrating a manufacturing method of a transistor.

Then, a base insulating layer 404 including silicon oxide as its main component is formed. As described above, the base insulating layer 404 is formed by a plasma CVD method using silicon tetrafluoride. By a plasma CVD method, the base insulating layer 404 can be formed even on side surfaces of the wirings 402a and 402b with good step coverage. The thickness of the base insulating layer 404 is preferably five or more times as thick as the total thickness of an oxide semiconductor layer and a gate insulating layer which are formed later. Note that since the base insulating layer 404 is etched in a later step, the base insulating layer 404 is preferably formed to have a large thickness accordingly. FIG. 9A shows the state obtained thus far.

Figure 9B:
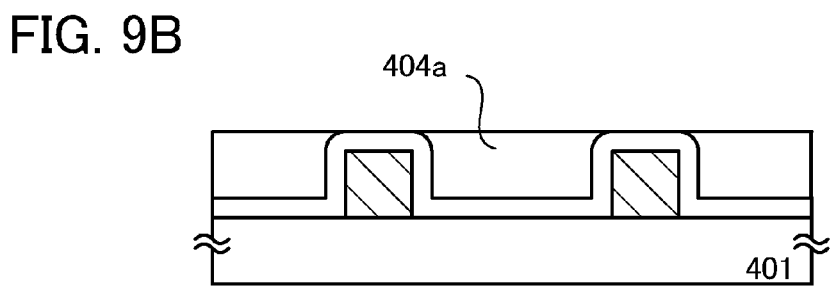
Figure 9C:
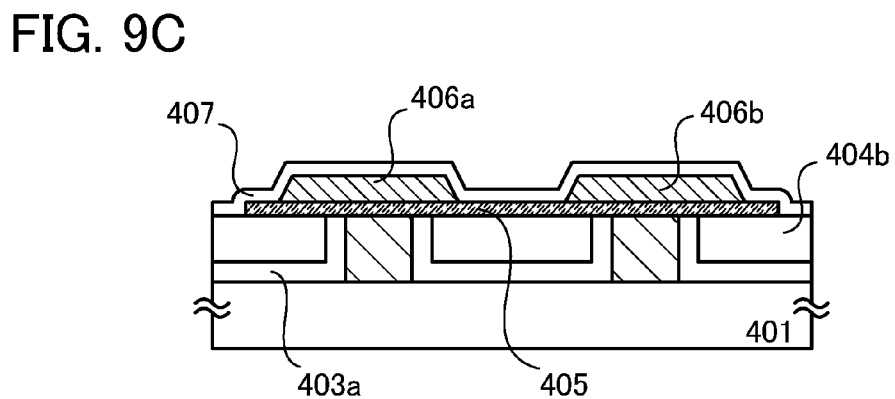

Then, by a known chemical mechanical processing (CMP) method, the base insulating layer 404 is etched while being planarized. This step can be stopped when the silicon nitride oxide film 403 is exposed. This is because silicon nitride oxide has a smaller etching rate in a CMP method than silicon oxide and therefore serves as an etching stopper. FIG. 9B shows the state obtained thus far. The base insulating layer 404 is divided (i.e., processed to be a base insulating layer 404a) with the use of the silicon nitride oxide film 403. The surface is substantially flat.

Then, by a dry etching method, the silicon nitride oxide film 403 and the base insulating layer 404a are etched by a substantially equal thickness to obtain a flat surface. This etching is stopped when surfaces of the wirings 402a and 402b are exposed. In this step, the base insulating layer 404a is further etched to be in a state illustrated as 404b in FIG. 9C.

After that, a top-gate transistor is formed as in Embodiments 2 and 3. In other words, an oxide semiconductor layer 405 is formed using an In—Ga—Zn—O-based film with a thickness of 10 nm to 20 nm, and a source electrode layer 406a and a drain electrode layer 406b are formed thereover. Further, a gate insulating layer 407 is formed (see FIG. 9C).

Here, the wiring 402a and the source electrode layer 406a are in contact with the oxide semiconductor layer 405 and they overlap with each other with the oxide semiconductor layer 405 interposed therebetween. Note that the wiring 402a and the source electrode layer 406a can be regarded as being electrically connected substantially although the oxide semiconductor layer 405 is interposed therebetween, because when an oxide semiconductor and a conductor are in ohmic contact, the carrier concentration in a region from the interface to a depth of approximately 10 nm in the oxide semiconductor is approximately $1 \times 10^{19}/cm^3$ or greater.

In order to form ohmic contact, portions of the wiring 402a and the source electrode layer 406a which are in contact with the oxide semiconductor layer 405 preferably include a material whose work function is smaller than the electron affinity of the oxide semiconductor layer 405. For example, titanium or titanium nitride may be used if the oxide semiconductor layer is an In—Ga—Zn—O-based oxide semiconductor having an electron affinity of approximately 4.3 electron volts. The same can be applied to the wiring 402b and the drain electrode layer 406b.

Figure 9D:
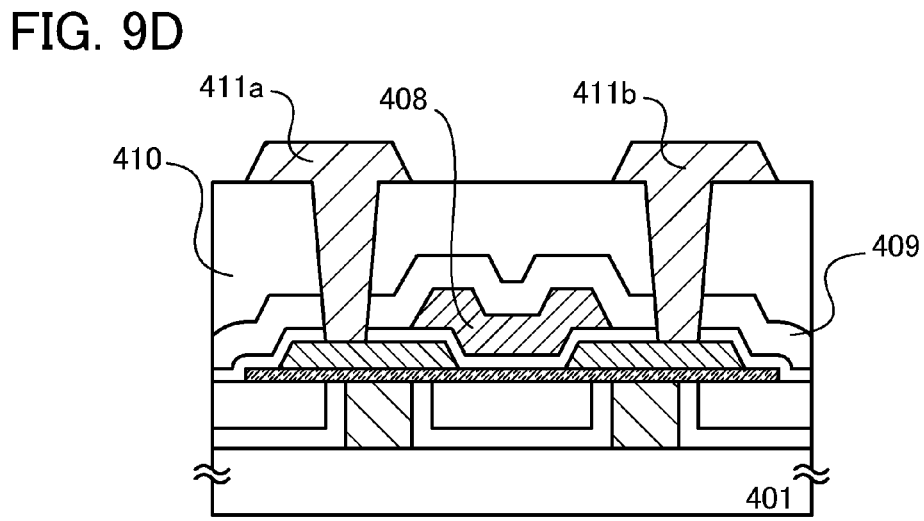

Then, a conductive film is formed to cover the gate insulating layer 407 and etched to form a gate electrode layer 408. After that, an insulating layer 409 is formed using silicon nitride and an insulating layer 410 which has a flat surface is formed using an organic resin or the like. Then, contact holes reaching the source electrode layer 406a and the drain electrode layer 406b are formed in the gate insulating layer 407, the insulating layer 409, and the insulating layer 410, and an electrode 411a and an electrode 411b are formed. FIG. 9D shows the state obtained thus far.

Through the above process, a top-gate transistor can be formed. This embodiment can be combined with any of the other embodiments.

Embodiment 5

The transistor described in the above embodiments is manufactured, and the transistor is used for a pixel portion and further for a driver circuit so as to manufacture and a semiconductor device having a display function (also referred to as a display device). Further, part or the whole of the driver circuit using the transistor can be formed over a substrate where the pixel portion is provided to form a system-on-panel. Furthermore, with a transistor including an oxide semiconductor material described in the above embodiment, a semiconductor device including a memory cell can also be manufactured.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes an inorganic EL (electroluminescence) element, an organic EL element, and the like. Furthermore, the display device may include a display medium whose contrast is changed by an electric effect, such as electronic ink.

In addition, the display device includes a panel in which the display element is sealed, and a module in which an IC or the like including a controller is mounted on the panel. Furthermore, the display device includes an element substrate provided with a means for supplying current to the display element in each of pixels, which is one embodiment before the display element is completed in a manufacturing process of the display device. Specifically, the element substrate may be in a state where only a pixel electrode of the display element is formed, a state in which a conductive film to be a pixel electrode is formed but is not etched yet to form the pixel electrode, or any other states.

Note that a display device in this specification refers to an image display device, a display device, or a light source (including a lighting device). Further, the display device also includes any of the following modules in its category: a module to which a connector such as a flexible printed circuit (FPC), a tape automated bonding (TAB) tape, or a tape carrier package (TCP) is attached; a module having a TAB tape or TCP provided with a printed wiring board at the end thereof; and a module having an integrated circuit (IC) that is directly mounted on a display element by a chip on glass (COG) method.

Embodiment 6

Figure 11:
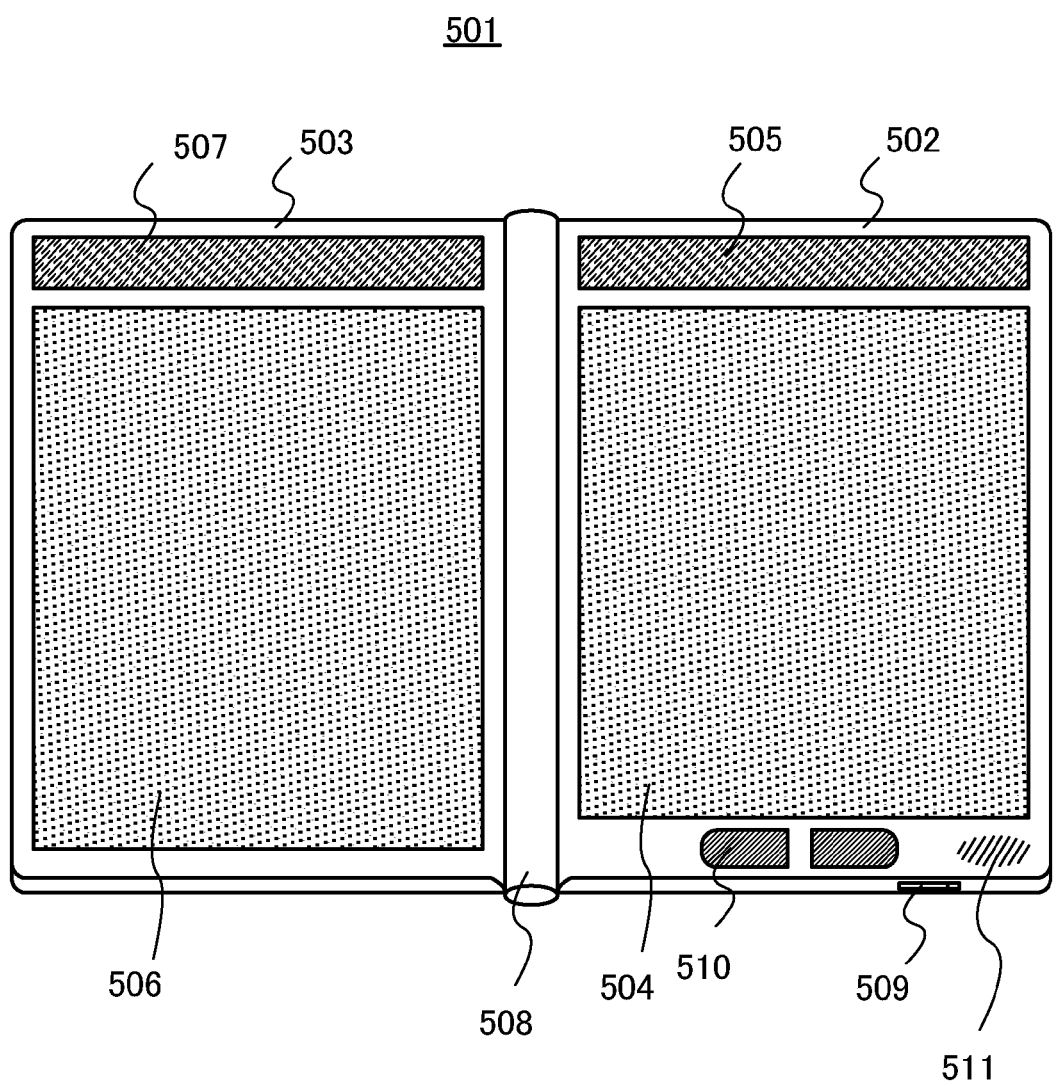
FIG. 11 is an external view illustrating an example of an electronic book reader.

A display device including the transistor manufactured by the method of manufacturing a transistor described in the above embodiments can be used for an electronic paper in which electronic ink is driven to perform display. The electronic paper can be used for electronic devices for displaying information in a variety of fields. For example, an electronic paper can be applied to an electronic book reader (an e-book reader), a poster, digital signage, public information displays (PIDs), advertisements in vehicles such as trains, and displays of various cards such as credit cards. FIG. 11 illustrates an example of the electronic devices.

An electronic book reader 501 in FIG. 11 includes two housings, a housing 502 and a housing 503. The housing 502 and the housing 503 are combined with a hinge 508 so that the electronic book reader 501 can be opened and closed along the hinge 508. With such a structure, the electronic book reader 501 can be handled like a paper book.

A display portion 504 and a photoelectric conversion device 505 are incorporated in the housing 502. A display portion 506 and a photoelectric conversion device 507 are incorporated in the housing 503. The display portion 504 and the display portion 506 may display one image or different images. In the case where the display portions display different images, for example, a display portion on the right (the display portion 504 in FIG. 11) can display text and a display portion on the left (the display portion 506 in FIG. 11) can display graphics.

FIG. 11 illustrates an example in which the housing 502 is provided with an operation portion and the like. For example, the housing 502 is provided with a power switch 509, operation keys 510, a speaker 511, and the like. Pages can be turned with the operation keys 510. Note that a keyboard, a pointing device, and the like may be provided on the same surface as the display portion of the housing. Moreover, an external connection terminal (an earphone terminal, a USB terminal, a terminal connectable to an AC adapter or a variety of cables such as a USB cable, or the like), a storage medium insertion portion, and the like may be provided on the back surface or the side surface of the housing. Moreover, the electronic book reader 501 may have a function of an electronic dictionary.

The electronic book reader 501 may be configured to wirelessly transmit and receive data. Through wireless communication, desired book data or the like can be purchased and downloaded from an electronic book server.

Embodiment 7

The semiconductor device disclosed in this specification can be applied to a variety of electronic devices (including game machines). Examples of such electronic devices include a television device (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio player, a large-sized game machine such as a pinball machine, and the like.

Figure 12A:
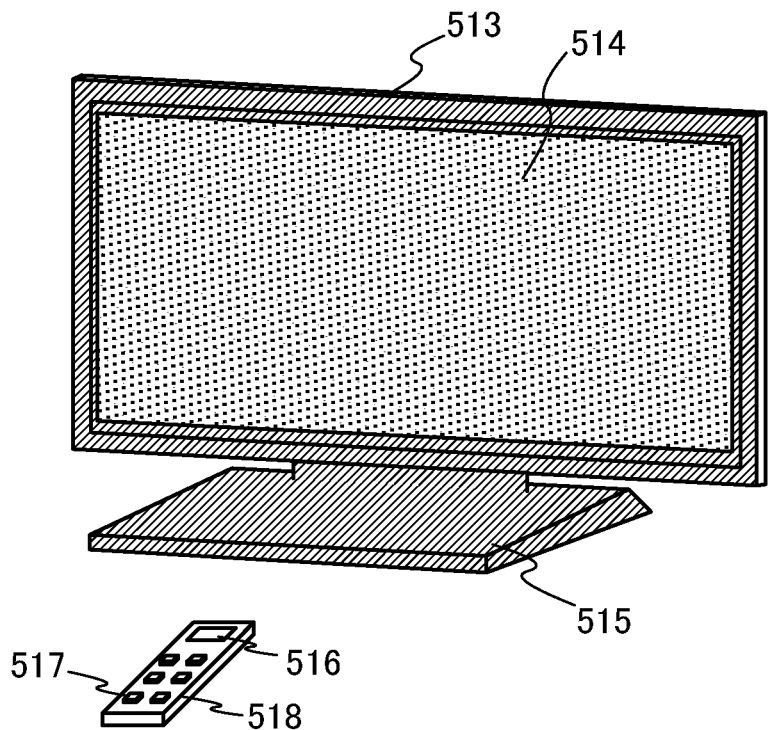
FIGS. 12A and 12B are external views illustrating examples of a television device and a digital photo frame.

In a television device 512 in FIG. 12A, a display portion 514 is incorporated in a housing 513. The display portion 514 can display images. Here, the housing 513 is supported by a stand 515.

The television device 512 can be operated with an operation switch of the housing 513 or a separate remote control 518. Channels can be switched and volume can be controlled with operation keys 517 of the remote control 518, whereby an image displayed on the display portion 514 can be controlled. Moreover, the remote control 518 may be provided with a display portion 516 for displaying data output from the remote control 518.

Note that the television device 512 is provided with a receiver, a modem, and the like. With the receiver, general TV broadcasts can be received. Moreover, when the display device is connected to a communication network with or without wires via the modem, one-way (from a sender to a receiver) or two-way (e.g., between a sender and a receiver or between receivers) information communication can be performed.

Figure 12B:
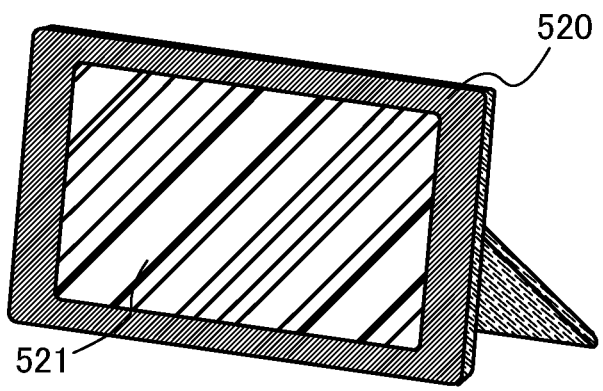

In a digital photo frame 519 in FIG. 12B, a display portion 521 is incorporated in a housing 520. The display portion 521 can display a variety of images. For example, the display portion can display image data taken with a digital camera or the like and function like a normal photo frame.

Note that the digital photo frame 519 is provided with an operation portion, an external connection terminal (a USB terminal, a terminal connectable to a variety of cables such as a USB cable), a storage medium insertion portion, and the like. Although these components may be provided on the same surface as the display portion, it is preferable to provide them on the side surface or the back surface for design aesthetics. For example, a storage medium storing image data taken with a digital camera is inserted into the storage medium insertion portion of the digital photo frame and the data can be loaded and displayed on the display portion 521.

The digital photo frame 519 may be configured to transmit and receive data wirelessly. Through wireless communication, desired image data can be loaded to be displayed.

Figure 13:
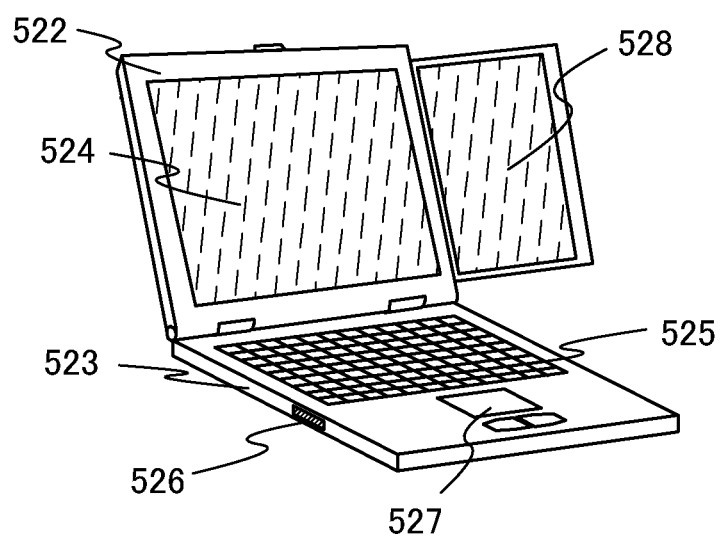
FIG. 13 is a perspective view illustrating an example of a portable computer.

FIG. 13 is a perspective view illustrating an example of a portable computer. In the portable computer illustrated in FIG. 13, a top housing 522 having a display portion 524 and a bottom housing 523 having a keyboard 525 can overlap with each other by closing a hinge unit which connects the top housing 522 and the bottom housing 523. Thus, the portable computer is conveniently carried. When the user uses the keyboard for input of data, the hinge unit is opened so that the user can input data looking at the display portion 524.

The bottom housing 523 includes a pointing device 527 with which input can be performed, in addition to the keyboard 525. When the display portion 524 is a touch screen, the user can input data by touching part of the display portion. The bottom housing 523 includes an arithmetic function portion such as a CPU or hard disk. In addition, the bottom housing 523 includes an external connection port 526 into which another device, for example, a communication cable conformable to communication standards of a USB is inserted.

The top housing 522 further includes a display portion 528 which can be stored in the top housing 522 by being slid therein. With the display portion 528, a large display screen can be realized. In addition, the user can adjust the angle of a screen of the stowable display portion 528. If the stowable display portion 528 is a touch screen, the user can input data by touching part of the stowable display portion.

The display portion 524 or the stowable display portion 528 is formed using an image display device such as a liquid crystal display panel or a light-emitting display panel such as an organic light-emitting element, an inorganic light-emitting element, or the like.

In addition, the portable computer illustrated in FIG. 13 can be provided with a receiver and the like and can receive a TV broadcast to display an image on the display portion 524 or the display portion 528. The user can watch a TV broadcast with the whole screen of the display portion 528 by sliding and exposing the display portion 528 and adjusting the angle thereof, with the hinge unit which connects the top housing 522 and the bottom housing 523 closed. The hinge unit is not opened and display is not performed on the display portion 524. In addition, only a circuit for displaying a TV broadcast is operated. Thus, power consumption can be minimized, which is advantageous for the portable computer whose battery capacity is limited.

Example 1

Figure 10:
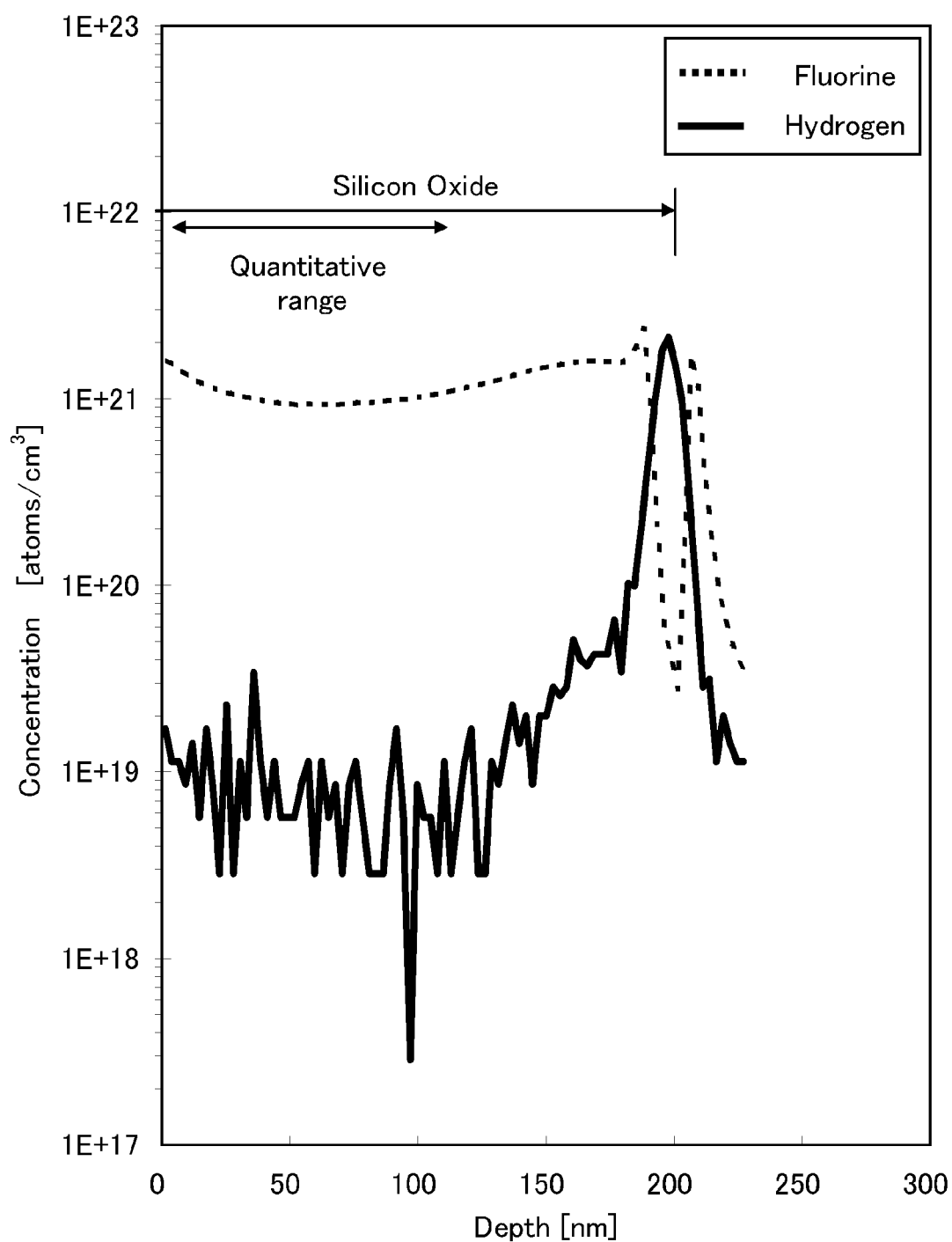
FIG. 10 shows the concentrations of hydrogen and fluorine in a silicon oxide layer.

A silicon oxide film (Sample A) which can be used as the gate insulating layer 104, the gate insulating layer 205, the gate insulating layer 306, the gate insulating layer 407, the insulating layer 108, the base insulating layer 202, the base insulating layer 302, and the base insulating layer 404, which are described above, was formed. The hydrogen concentration and the fluorine concentration in Sample A were evaluated. The results are shown in FIG. 10.

First, a method of forming Sample A will be described. Sample A was formed by a plasma CVD method. The inner wall of the reaction chamber in the plasma CVD apparatus was heated for 60 minutes to a temperature of 115° C.; thus, a gas containing impurities which is remaining in or attached to the reaction chamber were released.

Next, while the inner wall of the reaction chamber was heated at 115° C., plasma cleaning was carried out under the conditions that nitrogen trifluoride ($NF_3$) was supplied to the reaction chamber at a flow rate of 600 sccm, the pressure in the reaction chamber was adjusted to about 70 Pa, the gap distance was adjusted to 50 mm, and a power of 900 W was output with a high-frequency power source at 60 MHz for 7 minutes, whereby a gas containing impurities was removed. Note that the area of an electrode in the plasma CVD apparatus that is used in this example is 490 $cm^2$.

After the plasma cleaning, silicon oxide was deposited to a target thickness of 200 nm on a silicon wafer while the inner wall of the reaction chamber was heated at 115° C. Silicon oxide was deposited under the following conditions: silicon tetrafluoride as a deposition gas containing silicon, nitrous oxide as an additional gas, and argon as an inert gas were supplied to the reaction chamber at a flow rate of 6 sccm, 1000 sccm, and 1000 sccm, respectively; the pressure in the reaction chamber was adjusted to 133 Pa; the gap distance was adjusted to 10 mm; the temperature of the silicon wafer on which silicon oxide was deposited was adjusted to 400° C.; and a power of 800 W was output with a high-frequency power source at 60 MHz.

The SIMS measurement result of Sample A is shown in FIG. 10. In FIG. 10, the vertical axis represents the hydrogen concentration or fluorine concentration in Sample A, and the horizontal axis represents the depth from a surface of the silicon oxide film of Sample A toward the substrate. The solid line represents a profile of the hydrogen concentration in Sample A, and the broken line represents a profile of the fluorine concentration in Sample A. For Sample A, the range of 10 nm to 120 nm along the horizontal axis represents a quantitative range and the range of 200 nm or more along the horizontal axis represents the silicon wafer.

It is found from FIG. 10 that the hydrogen concentration in Sample A is less than or equal to $3.4 \times 10^{19}$ atoms/$cm^3$ in the quantitative range and the fluorine concentration in Sample A is greater than or equal to $9.2 \times 10^{20}$ atoms/$cm^3$ in the quantitative range.

A silicon oxide film from which hydrogen release is reduced and which can inactivate hydrogen in an oxide semiconductor layer was found to have the above hydrogen concentration and fluorine concentration.

A semiconductor device having good electrical characteristics can be formed by using the silicon oxide film in this example as the gate insulating layer 104, the gate insulating layer 205, the gate insulating layer 306, the gate insulating layer 407, the insulating layer 108, the base insulating layer 202, the base insulating layer 302, and the base insulating layer 404.

This application is based on Japanese Patent Application serial no. 2010-150849 filed with Japan Patent Office on Jul. 1, 2010, the entire contents of which are hereby incorporated by reference.

What is claimed is:

1. A semiconductor device comprising:
an insulating layer;
an oxide semiconductor layer on the insulating layer;
a gate insulating layer over the oxide semiconductor layer, a part of the gate insulating layer is in contact with the oxide semiconductor layer; and
a gate electrode layer over the gate insulating layer,
wherein a hydrogen concentration in the insulating layer is less than $6 \times 10^{20}$ atoms/$cm^3$ and a halogen concentration in the insulating layer is greater than or equal to $1 \times 10^{20}$ atoms/$cm^3$.

2. The semiconductor device according to claim 1, wherein the insulating layer is an oxide insulating layer.

3. The semiconductor device according to claim 1, wherein the gate insulating layer comprises silicon oxide, silicon oxynitride, silicon nitride oxide, hafnium oxide, aluminum oxide, or tantalum oxide.

4. The semiconductor device according to claim 1, wherein a thickness of the insulating layer is five or more times as thick as a total thickness of the oxide semiconductor layer and the gate insulating layer.

5. The semiconductor device according to claim 1, wherein the insulating layer is provided between a substrate and the oxide semiconductor layer.

6. The semiconductor device according to claim 1, wherein the halogen is fluorine.

7. The semiconductor device according to claim 1, wherein the insulating layer is formed by a plasma CVD method using a silicon halide.

8. A semiconductor device comprising:
an insulating layer;
an oxide semiconductor layer on the insulating layer;
a gate insulating layer over the oxide semiconductor layer, a part of the gate insulating layer is in contact with the oxide semiconductor layer; and
a gate electrode layer over the gate insulating layer,
wherein a hydrogen concentration in the insulating layer is less than $6 \times 10^{20}$ atoms/$cm^3$ and a halogen concentration in the insulating layer is greater than or equal to $1 \times 10^{20}$ atoms/$cm^3$, and
wherein a hydrogen concentration in the gate insulating layer is less than $6 \times 10^{20}$ atoms/$cm^3$ and a halogen concentration in the gate insulating layer is greater than or equal to $1 \times 10^{20}$ atoms/$cm^3$.

9. The semiconductor device according to claim 8, wherein the insulating layer is an oxide insulating layer.

10. The semiconductor device according to claim 8, wherein the gate insulating layer comprises silicon oxide, silicon oxynitride, silicon nitride oxide, hafnium oxide, aluminum oxide, or tantalum oxide.

11. The semiconductor device according to claim 8, wherein a thickness of the insulating layer is five or more times as thick as a total thickness of the oxide semiconductor layer and the gate insulating layer.

12. The semiconductor device according to claim 8, wherein the insulating layer is provided between a substrate and the oxide semiconductor layer.

13. The semiconductor device according to claim 8, wherein the halogen is fluorine.

14. The semiconductor device according to claim 8, wherein the insulating layer is formed by a plasma CVD method using a silicon halide.

15. A semiconductor device comprising:
   an oxide semiconductor layer;
   a gate electrode layer;
   a gate insulating layer formed between the gate electrode layer and the oxide semiconductor layer; and
   an insulating layer that faces the gate insulating layer with the oxide semiconductor layer interposed therebetween, the insulating layer being in contact with the oxide semiconductor layer,
   wherein a hydrogen concentration in the insulating layer is less than $6\times10^{20}$ atoms/cm$^3$ and a halogen concentration in the insulating layer is greater than or equal to $1\times10^{20}$ atoms/cm$^3$, and
   wherein the insulating layer is formed by a plasma CVD method using a silicon halide.

16. The semiconductor device according to claim 15, wherein the insulating layer is an oxide insulating layer.

17. The semiconductor device according to claim 15, wherein the gate insulating layer comprises silicon oxide, silicon oxynitride, silicon nitride oxide, hafnium oxide, aluminum oxide, or tantalum oxide.

18. The semiconductor device according to claim 15, wherein a thickness of the insulating layer is five or more times as thick as a total thickness of the oxide semiconductor layer and the gate insulating layer.

19. The semiconductor device according to claim 15, wherein the insulating layer is provided between a substrate and the oxide semiconductor layer.

20. The semiconductor device according to claim 15, wherein the halogen is fluorine.

* * * * *